(12) United States Patent
Natsuaki

(10) Patent No.: US 8,203,846 B2
(45) Date of Patent: Jun. 19, 2012

(54) SEMICONDUCTOR PHOTODETECTOR ELEMENT AND SEMICONDUCTOR DEVICE

(75) Inventor: Kazuhiro Natsuaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 17 days.

(21) Appl. No.: 12/861,606

(22) Filed: Aug. 23, 2010

(65) Prior Publication Data

US 2011/0042556 A1 Feb. 24, 2011

(30) Foreign Application Priority Data

Aug. 24, 2009 (JP) ................................ 2009-192822
Jul. 7, 2010 (JP) ................................ 2010-154742

(51) Int. Cl.
*H05K 1/18* (2006.01)
(52) U.S. Cl. ........ 361/761; 361/783; 361/806; 361/820; 361/760; 174/250
(58) Field of Classification Search .................. 361/760, 361/761, 783, 806, 820; 174/250, 260
See application file for complete search history.

(56) References Cited

U.S. PATENT DOCUMENTS

| 7,180,846 B2 * | 2/2007 | Kim et al. ................ 369/112.17 |
| 7,262,404 B2 * | 8/2007 | Yamaguchi et al. .......... 250/226 |
| 7,960,807 B2 * | 6/2011 | Lin et al. ..................... 257/440 |
| 2004/0061152 A1 | 4/2004 | Kashiura et al. |
| 2005/0103983 A1 * | 5/2005 | Yamaguchi et al. ....... 250/214.1 |
| 2006/0187381 A1 * | 8/2006 | Yokozawa .................... 349/106 |
| 2007/0194217 A1 * | 8/2007 | Takiba et al. ................. 250/226 |

FOREIGN PATENT DOCUMENTS

| JP | 2004-119713 A1 | 4/2004 |
| JP | 2004-309701 A | 11/2004 |
| JP | 2006-148014 A | 6/2006 |
| JP | 2006-318947 A | 11/2006 |
| JP | 2007-227551 A | 9/2007 |

\* cited by examiner

*Primary Examiner* — Hoa C Nguyen
(74) *Attorney, Agent, or Firm* — Birch, Stewart, Kolasch & Birch, LLP

(57) ABSTRACT

Provided is a semiconductor photodetector element which is reduced in manufacturing cost and improved in precision. The semiconductor photodetector element includes: a first photodiode formed in a P-type silicon substrate; a second photodiode formed in the P-type silicon substrate and has the same structure as that of the first photodiode; a color filter layer formed above the first photodiode from a green filter; a color filter layer formed of a black filter above the second photodiode; and an arithmetic circuit portion which subtracts a detection signal of the second photodiode from a detection signal of the first photodiode.

20 Claims, 18 Drawing Sheets

SEMICONDUCTOR PHOTODETECTOR ELEMENT AND SEMICONDUCTOR DEVICE

This application is based on Japanese Patent Application No. 2009-192822 filed on Aug. 24, 2009, and Japanese Patent Application No. 2010-154742 filed on Jul. 7, 2010, the contents of which are hereby incorporated by reference into this application.

BACKGROUND OF THE INVENTION

1. Field of the Invention

The present invention relates to a semiconductor photodetector element and a semiconductor device that includes the semiconductor photodetector element.

2. Description of Related Art

In recent years, various portable devices including cellular phone terminals have been developed as a product. These portable devices usually operate on batteries and are therefore requested to be low in power consumption. The power consumption of the portable devices has increased due to the sophistication of their functions, and the resultant shortening of battery life is a serious problem.

Those portable devices generally include an image display screen such as a liquid crystal display screen, and most of the power consumed by the portable devices is spent on displaying data on the screen. Equipping a portable device with a function of stopping displaying when there is no need to display on the screen is therefore an effective measure to reduce the power consumption. In a case of a cellular phone terminal, for example, automatically stopping the screen display operation while on call when there is no need to display on the screen reduces the power consumption and accordingly prolongs the battery life of the cellular phone terminal.

Usually, a cellular phone terminal is put close to the head of its user when the user is talking on the cellular phone terminal. Some conventional cellular phone terminals therefore employ a proximity sensor which is mounted in the vicinity of the phone's speaker and detects the distance between the phone terminal and the head of the user in order to determine whether the user is talking on the phone terminal or not. The proximity sensor includes a light emitting element, which uses a light emitting diode (LED) that emits near-infrared light, and a light receiving element, which uses a photodiode. Near-infrared light emitted from the light emitting element is reflected by the head of the user, and the light receiving element receives the reflected light, thereby detecting whether or not the head of a person is close to the speaker of the phone terminal. Detecting the head of a person near the speaker of the phone terminal, the proximity sensor controls the phone terminal such that displaying on the screen is automatically turned off.

In recent years, people have become more aware of global warming and other environmental concerns, and image display devices such as television sets, too, are demanded to be reduced in power consumption. The demand for lower power consumption is more intense for portable devices with a television function or a similar function, which are lately gaining popularity, because the portable devices operate on batteries. In portable devices with a television function or a similar function, using a proximity sensor as the one described above (ranging sensor) is being considered as a way to automatically turn off displaying on the screen when no one is around.

Another effective measure used to reduce power consumption is adjusting the brightness of the display screen automatically to a level suitable to the brightness of the surroundings. Specifically, an illuminance sensor which detects the brightness of the surroundings is mounted to automatically adjust luminance of the display screen based on illuminance data provided by the illuminance sensor and thus optimize the luminance of the display screen. In this way, a reduction in power consumption and improvement in display screen visibility are accomplished simultaneously.

The illuminance sensor commonly employed for this use is a photodiode formed on a semiconductor substrate. The illuminance sensor that uses a photodiode has sensitivity to invisible light such as infrared light in addition to visible light whereas the human eye is sensitive to light in the visible light range. Therefore, when ambient light contains infrared light, the influence of the infrared light creates a difference between the brightness perceived by the human eye and the brightness detected by the illuminance sensor. A conventional solution is therefore to remove the unnecessary infrared light by placing an interference filter film that blocks infrared light above the photodiode.

However, the interference filter film is manufactured by a laborious manufacture process in which evaporation on a glass substrate is repeated, and its multi-layer structure containing layers of a plurality of materials makes the manufacturing cost very high. Using the interference filter film thus poses a problem of increased cost in the manufacture of an illuminance sensor. Another problem is that the additional space required to dispose the interference filter film makes size reduction difficult.

There has been conventionally proposed an illuminance sensor that is lowered in sensitivity to infrared light without needing the interference filter film. This type of illuminance sensor is described in, for example, Japanese Patent Application Laid-open No. 2004-119713.

The illuminance sensor described in Japanese Patent Application Laid-open No. 2004-119713 lowers its sensitivity to infrared light by forming two photodiodes of different depths in a semiconductor layer such that the photodiodes overlap each other in the longitudinal direction, and computing detection signals of the respective photodiodes. In this illuminance sensor, a first photodiode is formed on a surface side of the semiconductor layer and a second photodiode is formed below the first photodiode. A detection signal of the second photodiode is multiplied by a given number and then subtracted from a detection signal of the first photodiode to lower the sensitivity to infrared light.

Inconveniently, the conventional illuminance sensor described in Japanese Patent Application Laid-open No. 2004-119713 has difficulties in reducing the difference in sensitivity to infrared light between the two photodiodes due to the differences in structure, conductivity type, impurity profile, and the like between the two photodiodes. The difference in sensitivity to infrared light between the two photodiodes makes it difficult to completely eliminate the influence of infrared light through computing. Thus, it is difficult to sufficiently lower the illuminance sensor's sensitivity to infrared light. Consequently, improving precision is difficult for the illuminance sensor described in Japanese Patent Application Laid-open No. 2004-119713.

Some cellular phone terminals and other portable devices require the functions of the proximity sensor and the illuminance sensor both to reduce power consumption. Mounting a sensor that has the proximity sensing function and a sensor that has the illuminance detecting function separately creates problems in terms of cost and packaging size. For that reason, the successful development of a semiconductor photodetector element with a proximity sensor and an illuminance sensor formed on the same chip has been sought after.

However, when a proximity sensor and an illuminance sensor are formed on the same chip, infrared light incident on the proximity sensor enters the illuminance sensor as well. This is a problem in the case where the illuminance sensor side of the semiconductor photodetector element takes the structure of the illuminance sensor described in Japanese Patent Application Laid-open No. 2004-119713, because the infrared light causes the illuminance sensor to malfunction.

SUMMARY OF THE INVENTION

The present invention has been made to solve the problems as described above, and an object of the present invention is therefore to provide a semiconductor photodetector element and a semiconductor device that are reduced in manufacturing cost and improved in precision.

Another object of the present invention is to provide a semiconductor photodetector element and a semiconductor device that have high reliability.

Still another object of the present invention is to provide a semiconductor photodetector element and a semiconductor device that are reduced in size.

In order to achieve the above-mentioned object, according to a first aspect of the present invention, there is provided a semiconductor photodetector element including: a first light receiving element portion which is formed in a semiconductor layer of one conductivity type; a second light receiving element portion which is formed in the semiconductor layer and has the same structure as that of the first light receiving element portion; a first filter which is formed above the first light receiving element portion and transmits light in a first wavelength range and light in a second wavelength range, which differs from the first wavelength range; and a second filter which is formed above the second light receiving element portion and transmits light in a third wavelength range, which is contained within the second wavelength range. Further, the semiconductor photodetector element is structured to calculate a difference between a detection signal of the first light receiving element portion and a detection signal of the second light receiving element portion. The "semiconductor layer" of the present invention includes a semiconductor substrate. The "first filter" and "second filter" of the present invention are not interference filter films.

In the semiconductor photodetector element according to the first aspect, as described above, the first filter which transmits light in the first wavelength range and light in the second wavelength range is formed above the first light receiving element portion, and the second filter which transmits light in the third wavelength range contained within the second wavelength range is formed above the second light receiving element portion. Light in the first wavelength range and light in the second wavelength range are thus detected by the first light receiving element portion whereas light in the third wavelength range, which is within the second wavelength range, is detected by the second light receiving element portion. The detection signal of the second light receiving element portion is subtracted from the detection signal of the first light receiving element portion, to thereby lower the sensitivity to light in the second wavelength range. When light in the first wavelength range is visible light and light in the second wavelength range and light in the third wavelength range are infrared light, for example, the sensitivity to infrared light is lowered. With this structure, the influence of infrared light is eliminated and a sensor (illuminance sensor) that has wavelength sensitivity characteristics close to the human visibility characteristics is obtained as a result.

Forming the second filter above the second light receiving element portion enables the second light receiving element portion to detect light in the third wavelength range, which differs from the first wavelength range. The second light receiving element portion can therefore be used also as a light receiving element that detects light from a light emitting element that emits light in the third wavelength range. In other words, the second light receiving element portion can be used as a light receiving element of a proximity sensor (ranging sensor) as well. An illuminance sensor and a proximity sensor (ranging sensor) can thus be formed on a single chip. With an illuminance sensor and a proximity sensor (ranging sensor) formed on one chip, the packaging size of the semiconductor photodetector element is reduced and a package (semiconductor device) to which the semiconductor photodetector element is mounted is accordingly reduced in size.

In the first aspect, where the first filter and the second filter are formed above the first light receiving element portion and the second light receiving element portion, respectively, there is no need for interference filter films, which are expensive, and the manufacturing cost is lowered accordingly. The first filter and the second filter may be, for example, organic color filters used in color image sensors and the like.

In the first aspect, where the first light receiving element portion and the second light receiving element portion have the same structure, differences in impurity profile and the like between the first light receiving element portion and the second light receiving element portion are reduced, and the sensitivity difference between the first light receiving element portion and the second light receiving element portion is accordingly smaller. In other words, the sensitivity characteristics of the first light receiving element portion and the sensitivity characteristics of the light receiving element portion are made equal to each other. This means that the sensitivity to light in the second wavelength range is lowered sufficiently by simply subtracting a detection signal of the second light receiving element portion from a detection signal of the first light receiving element portion, without multiplying the detection signal of the second light receiving element portion by a given number. The influence of light in the second wavelength range is thus eliminated effectively and a semiconductor photodetector element that has high precision is obtained.

In the first aspect, where the first light receiving element portion and the second light receiving element portion are formed in the same semiconductor layer, light incident on the first light receiving element portion enters the second light receiving element portion as well, with the result that the influence of light in the second wavelength range is eliminated effectively by subtracting a detection signal of the second light receiving element portion from a detection signal of the first light receiving element portion. Therefore, in the case where light in the second wavelength range and light in the third wavelength range are infrared light (near-infrared light), the influence of the infrared light is effectively eliminated. This means that the influence of infrared light is eliminated and prevented from causing malfunction even when forming a proximity sensor and an illuminance sensor on the same chip allows infrared light incident on the second light receiving element portion to enter the first light receiving element portion. The reliability is improved as a result.

Structured as above, the semiconductor photodetector element according to the first aspect allows light to enter the first light receiving element portion and the second light receiving element portion alike. Ambient light or other light irradiating the semiconductor photodetector element is thus incident on the first light receiving element portion and on the second light receiving element portion in the same manner. Then the influence of incident ambient light or the like is eliminated by subtracting a detection signal of the second light receiving element portion from a detection signal of the first light receiving element portion. The semiconductor photodetector element according to the first aspect may also be used as a simple illuminance sensor or a simple proximity sensor.

In the semiconductor photodetector element according to the first aspect of the present invention, it is preferred that a plurality of the first light receiving element portions be formed in the semiconductor layer to be connected in parallel to one another, and that the same number of the second light receiving element portions as a number of the first light receiving element portions be formed in the semiconductor layer to be connected in parallel to one another. Further, the first light receiving element portions and the second light receiving element portions are arranged alternately. When the semiconductor photodetector element structured as above is irradiated with light, light incident on the first light receiving element portion and light incident on the second light receiving element portion are easily made substantially equal to each other. It is therefore easy to make ambient light or the like irradiating the semiconductor photodetector element enter the first light receiving element portion and the second light receiving element portion in the same manner. Then the influence of incident ambient light or the like is easily eliminated by subtracting a detection signal of the second light receiving element portion from a detection signal of the first light receiving element portion. With malfunction due to the influence of ambient light or the like being easily prevented, the reliability is improved even more.

When this semiconductor photodetector element is mounted along with a light emitting element to a package (semiconductor device) and the semiconductor device is mounted to a device, seeping light from the light emitting element may enter the semiconductor photodetector element in some cases. However, the semiconductor photodetector element structured as above can readily eliminate the influence of the seeping light from the light emitting element as with the case for ambient light or other light irradiating the semiconductor photodetector element. The semiconductor photodetector element structured as above thus makes it easy to improve the precision of an illuminance sensor.

In the configuration including the plurality of the first light receiving element portions and a plurality of the second light receiving element portions, it is preferred that the first light receiving element portions and the second light receiving element portions be arranged close to one another. The semiconductor photodetector element structured as above is even more improved in precision.

In the configuration including the plurality of the first light receiving element portions and a plurality of the second light receiving element portions, it is preferred that the first light receiving element portions and the second light receiving element portions be arranged in a vertically and horizontally symmetrical pattern in plan view. The semiconductor photodetector element structured as above is further improved in precision.

Further, in the configuration including the plurality of the first light receiving element portions and a plurality of the second light receiving element portions, two first light receiving element portions and two second light receiving element portions may be formed in the semiconductor layer, and the two first light receiving element portions and the two second light receiving element portions may be arranged close to one another in a grid pattern.

In the semiconductor photodetector element according to the first aspect of the present invention, the first wavelength range may be a visible light range of 450 nm to 650 nm, and the second wavelength range and the third wavelength range may each be a near-infrared range of 700 nm and above. This way, it is easy to obtain a semiconductor photodetector element in which a sensor (illuminance sensor) with its sensitivity to infrared light lowered to have spectral sensitivity characteristics close to the human visibility characteristics and a sensor receiving near-infrared light (proximity sensor) are formed on the same chip.

It is preferred that the semiconductor photodetector element according to the first aspect of the present invention further include a first sensor portion for detecting a brightness of surroundings, which includes the first light receiving element portion and the first filter, and that the first sensor portion have a peak sensitivity in a wavelength range of 450 nm to 650 nm and also have sensitivity in a wavelength range of 700 nm and above. With this structure, by subtracting a detection signal of the second light receiving element portion from a detection signal of the first light receiving element portion, the first sensor portion can function as a sensor (illuminance sensor) that has its peak sensitivity in the visible light range and is lowered in sensitivity to infrared light to imitate the human visibility characteristics more closely.

It is preferred that the semiconductor photodetector element according to the first aspect of the present invention further include a second sensor portion for detecting a distance from a target, which includes the second light receiving element portion and the second filter, and that the second sensor portion have sensitivity in a wavelength range of 700 nm and above in terms of spectral sensitivity. With this structure, the second light receiving element portion can have spectral sensitivity characteristics close to those of the first light receiving element portion in a wavelength range of 700 nm and above. The sensitivity to infrared light is thus lowered sufficiently by subtracting a detection signal that is detected by the second light receiving element portion from a detection signal that is detected by the first light receiving element portion. Another advantage of this structure is that the second sensor portion can readily function as a sensor that receives near-infrared light (proximity sensor).

In the semiconductor photodetector element according to the first aspect of the present invention, it is preferred that the first filter and the second filter make spectral sensitivity characteristics of the first light receiving element portion and spectral sensitivity characteristics of the second light receiving element portion practically equal to each other in a wavelength range of 700 nm and above. With this structure, the sensitivity to light in a long wavelength range of 700 nm and above is lowered even more sufficiently. A sensor (illuminance sensor) from which the influence of infrared light is eliminated even more thoroughly is obtained as a result.

In the semiconductor photodetector element according to the first aspect of the present invention, it is preferred that the first filter be a green filter, and that the second filter be a black filter. With this structure, the first filter and the second filter can be formed by a method that is commonly used in the back-end process, which makes it easy to form the filters (first filter and second filter) above the light receiving element portions (first light receiving element portion and second light receiving element portion). The manufacturing cost is thus reduced with ease. Another advantage of this structure where the first filter is a green filter, which transmits visible light and infrared light, and the second filter is a black filter, which blocks visible light but transmits infrared light, is that it is easy to form a filter (first filter) that transmits light in a wavelength range of 450 nm to 600 nm (visible light) as well as light in a wavelength range of 700 nm and above (infrared light) and a filter (second filter) that transmits light in a wavelength range of 700 nm and above (infrared light).

Forming a green filter above the first light receiving element portion gives the first light receiving element portion sensitivity characteristics substantially equal to the human visibility characteristics in the visible light range. On the other hand, a green filter and a black filter which are organic filters both transmit infrared light. The sensitivity to light in a long wavelength range of 700 nm and above is therefore lowered further by subtracting a detection signal of the second light receiving element portion above which a black filter is formed from a detection signal of the first light receiving element portion above which a green filter is formed. A sensor (illuminance sensor) that has wavelength sensitivity characteristics even closer to the human visibility characteristics is obtained as a result.

In the semiconductor photodetector element according to the first aspect of the present invention, it is preferred that the semiconductor layer include an arithmetic circuit portion formed therein to calculate a difference between a detection signal of the first light receiving element portion and a detection signal of the second light receiving element portion.

In the semiconductor photodetector element according to the first aspect of the present invention, it is preferred that the semiconductor layer be a P-type semiconductor layer, that the first light receiving element portion and the second light receiving element portion each include an N-type well layer, which is formed by diffusion on a top side of the P-type semiconductor layer, and a P-type well layer, which is formed by diffusion on a top side of the N-type well layer, and that detection signals of the first light receiving element portion and the second light receiving element portion be taken out of the P-type well layer. In short, it is preferred if the first light receiving element portion and the second light receiving element portion both have a common cathode.

In this case, it is preferred that the N-type well layer be formed to have a thickness of 7 μm or more and 10 μm or less. With this structure, which utilizes the fact that different wavelengths have different penetration lengths, the absorption of long wavelength light in the N-type well layer is reduced and the sensitivity to long wavelength light is accordingly lowered. The sensitivity to infrared light is lowered more sufficiently by subtracting a detection signal of the second light receiving element portion from a detection signal of the first light receiving element portion while keeping the sensitivity to long wavelength light low.

In the semiconductor photodetector element according to the first aspect of the present invention, it is preferred that the second filter be a single film. This structure simplifies the manufacture process, to thereby provide another way to reduce the manufacturing cost. The second filter may be formed of a multi-layer film. For instance, layering a green filter and a red filter creates a filter equivalent in function to a black filter, which blocks visible light but transmits infrared light.

In the semiconductor photodetector element according to the first aspect of the present invention, it is preferred that the semiconductor layer further include a third light receiving element portion formed to frame the first light receiving element portion and the second light receiving element portion in plan view. With this structure, excess carriers generated by the incidence of light on other regions than light receiving faces of the first light receiving element portion and the second light receiving element portion are captured in the third light receiving element portion. A photoelectric current generated in other regions than the first light receiving element portion and the second light receiving element portion is thus removed, which improves the precision of the semiconductor photodetector element more.

In this case, it is preferred that the third light receiving element portion be a diffusion layer, which has a conductivity type reverse to that of the semiconductor layer, formed in a surface region of the semiconductor layer, and that the diffusion layer have a depth equal to or greater than a depth of the first light receiving element portion and the second light receiving element portion. With this structure, excess carriers generated by incident light from the sides and back of the semiconductor photodetector element are readily captured in the third light receiving element portion, and a photo current running deep in the semiconductor photodetector element is removed as well. In this case, it is preferred that a depletion layer be extended by applying as high a reverse bias voltage as possible to the third light receiving element portion.

According to a second aspect of the present invention, there is provided a semiconductor device including: a light emitting element which emits light toward a target; and the semiconductor photodetector element according to the first aspect which receives light reflected from the target.

In the semiconductor device according to the second aspect which includes a semiconductor photodetector element and a light emitting element as described above, an illuminance sensor and a proximity sensor are integrated into a single package. The semiconductor device is therefore reduced in size.

In the second aspect where the semiconductor photodetector element of the first aspect is mounted, there is no need to use an expensive interference filter film and the manufacturing cost is accordingly reduced. In addition, the package (semiconductor device) is readily reduced in size because there is no need to secure a space for attaching an interference filter film.

With the semiconductor photodetector element of the first aspect mounted, the semiconductor device according to the second aspect is high in precision. The semiconductor device structured as above is also capable of preventing malfunction and therefore has improved reliability.

In the semiconductor device according to the second aspect which is structured as above, light seeping from the light emitting element may enter the semiconductor photodetector element but the influence of the light seeping from the light emitting element is eliminated.

The semiconductor device according to the second aspect which is structured as above can be employed in, for example, portable devices such as cellular phone terminals, and a portable device employing the semiconductor device has low power consumption and high screen visibility. The semiconductor device can also be employed in various video devices such as television sets and, when employed in a video device, the semiconductor device reduces the power consumption of the video device and gives high visibility to its display (image display device).

In the semiconductor device according to the second aspect of the present invention, it is preferred that the light emitting element be an infrared light emitting diode element which emits near-infrared light at a light emission wavelength of 700 nm or more and 1,150 nm or less.

It is preferred that the semiconductor device according to the second aspect of the present invention further include a first lens, which is placed above the light emitting element to focus light from the light emitting element on a target.

It is preferred that the semiconductor device according to the second aspect of the present invention further include one second lens, which is placed above the first light receiving element portion and the second light receiving element portion in the semiconductor photodetector element to focus light on the semiconductor photodetector element. With this structure, the sensors can share a lens instead of using their respective lenses (lens for the illuminance sensor and a lens for the proximity sensor), to thereby provide another way to reduce the manufacturing cost.

As described above, according to the present invention, a semiconductor photodetector element and a semiconductor device that are reduced in manufacturing cost and improved in precision are easily obtained.

According to the present invention, a semiconductor photodetector element and a semiconductor device that have high reliability are easily obtained.

According to the present invention, a semiconductor photodetector element and a semiconductor device that are reduced in size are easily obtained.

DETAILED DESCRIPTION OF PREFERRED EMBODIMENTS

Concrete embodiments of the present invention are described below in detail with reference to the drawings.

First Embodiment

Figure 1:
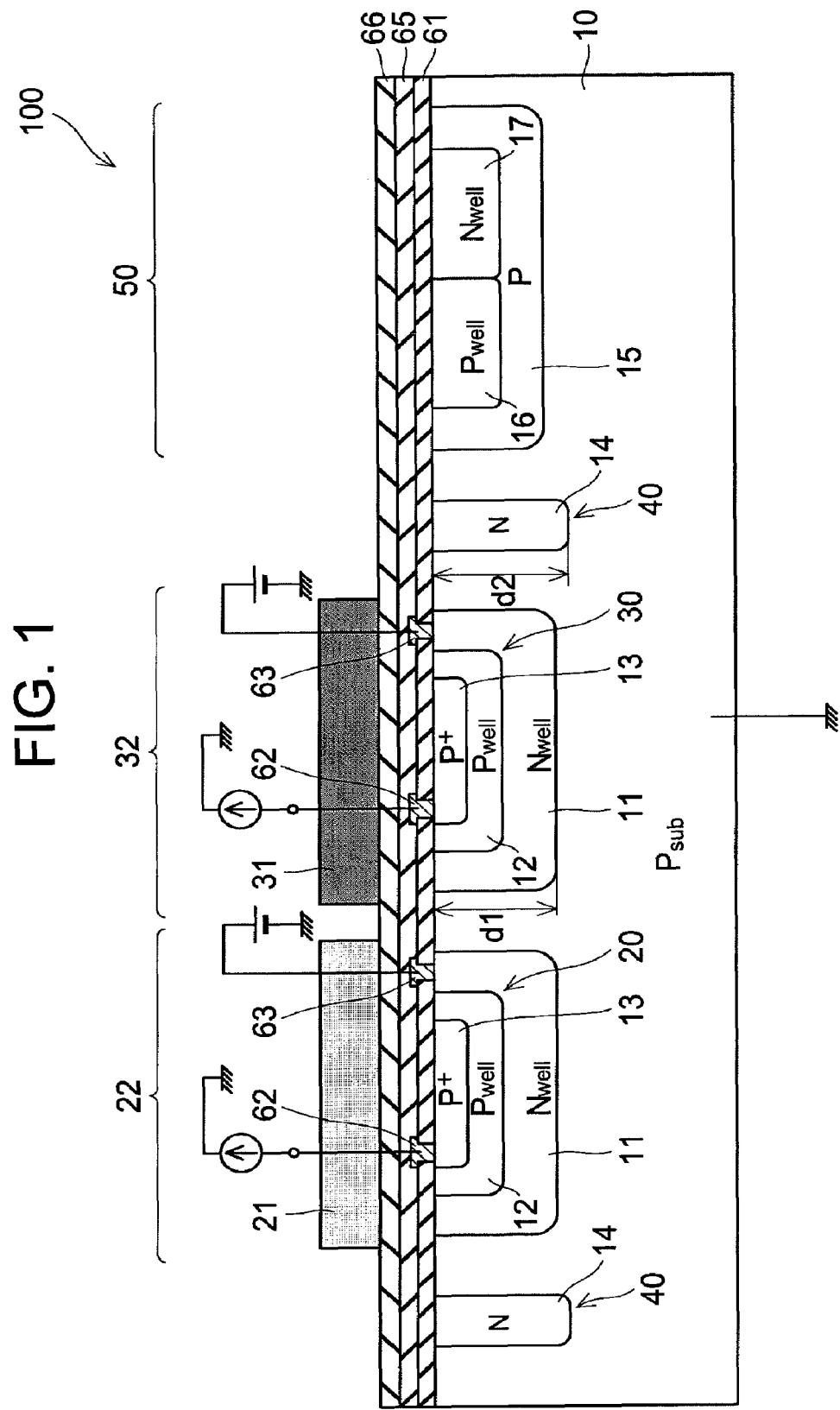
FIG. 1 is a sectional view illustrating a semiconductor photodetector element according to a first embodiment of the present invention.
Figure 2:
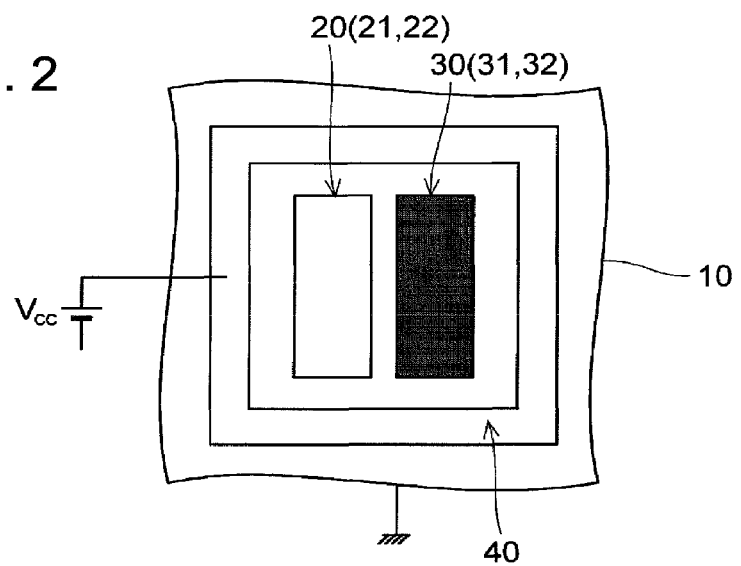
FIG. 2 is a plan view illustrating part of the semiconductor photodetector element according to the first embodiment of the present invention.

FIG. 1 is a sectional view illustrating a semiconductor photodetector element according to a first embodiment of the present invention. FIG. 2 is a plan view illustrating part of the semiconductor photodetector element according to the first embodiment of the present invention. FIGS. 3 to 11 are diagrams illustrating the structure of the semiconductor photodetector element according to the first embodiment of the present invention. First, a description is given with reference to FIGS. 1 to 11 of the structure of the semiconductor photodetector element according to the first embodiment of the present invention which is denoted by 100.

The semiconductor photodetector element 100 according to the first embodiment has a function of an illuminance sensor and a function of a proximity sensor. The semiconductor photodetector element 100 according to the first embodiment is structured as illustrated in FIG. 1, where a plurality of photodiodes are formed in a P-type silicon substrate 10 to which P-type impurities are introduced at a relatively low concentration (for example, $1 \times 10^{15}$ cm$^{-3}$). The plurality of photodiodes include a first photodiode 20 and a second photodiode 30, which have the same structure as that of the first photodiode 20. The first photodiode 20 and the second photodiode 30 are formed side by side. The first photodiode 20 and the second photodiode 30 are also formed such that their light receiving faces have the same area. The P-type silicon substrate 10 is an example of a "semiconductor layer" and a "P-type semiconductor layer" of the present invention. The first photodiode 20 is an example of a "first light receiving element portion" of the present invention, and the second photodiode 30 is an example of a "second light receiving element portion" of the present invention.

To describe the structure of the first photodiode 20 and the second photodiode 30 concretely, an N-type well layer 11 is formed in given regions on a surface side of the P-type silicon substrate 10. The N-type well layer 11 is formed by selective diffusion of N-type impurities from the surface side of the P-type silicon substrate 10. The impurity concentration of the N-type well layer 11 is, for example, about $1 \times 10^{16}$ cm$^{-3}$. A P-type well layer 12 is formed on a surface side of the N-type well layer 11. A P$^+$-type well layer 13, which is doped with P-type impurities by ion implantation at a concentration higher than in the P-type well layer 12, is formed on a surface side of the P-type well layer 12. The P-type well layer 12 and the P$^+$-type well layer 13 are each formed by the selective diffusion of P-type impurities from the surface side of the P-type silicon substrate 10. The impurity concentration of the P-type well layer 12 is, for example, about $5 \times 10^{17}$ cm$^{-3}$ and the impurity concentration of the P$^+$-type well layer 13 is, for example, about $1 \times 10^{20}$ cm$^{-3}$. PN junctions formed between the P-type well layer 12 and the N-type well layer 11 constitute the photodiodes (first photodiode 20 and second photodiode 30).

As illustrated in FIGS. 1 and 2, a frame-like third photodiode 40 is formed in given regions of the P-type silicon substrate 10 to frame the first photodiode 20 and the second photodiode 30. The third photodiode 40 is constituted of a PN junction between an N-type semiconductor layer 14, which is formed by the selective diffusion of N-type impurities, and the P-type silicon substrate 10. The impurity concentration of the N-type semiconductor layer 14 is, for example, about $1 \times 10^{16}$ cm$^{-3}$. The third photodiode 40 is an example of a "third light receiving element portion" of the present invention, and the N-type semiconductor layer 14 is an example of a "diffusion layer" of the present invention.

The N-type impurities used here are P (phosphorus) and the P-type impurities used here are B (boron).

In the first embodiment, the N-type well layer 11 is formed to have a thickness d1 (the depth after diffusion by ion implantation), which is approximately 7 μm to 10 μm. The N-type semiconductor layer 14 constituting part of the third photodiode 40 is formed to have a thickness d2 (the depth after diffusion by ion implantation), which is thicker than the depth d1 of the N-type well layer 11.

As illustrated in FIG. 1, a signal processing circuit is formed in the P-type silicon substrate 10 and includes an arithmetic circuit portion 50, which calculates the difference between a detection signal detected by the first photodiode 20 and a detection signal detected by the second photodiode 30. The arithmetic circuit portion 50 is formed of, for example, a complementary metal oxide semiconductor (CMOS) circuit and includes, among others, a P-type semiconductor layer 15, a P-type well region 16, and an N-type well region 17, which are formed in the P-type silicon substrate 10. Also formed in the arithmetic circuit portion 50 are a gate insulating film (not shown), which constitutes a transistor, a gate electrode (not shown), which is formed of polysilicon, and a diffusion layer (not shown), which constitutes a source and a drain.

A selective oxidization film (not shown) is formed in the P-type silicon substrate 10 as well to isolate elements through electrical insulation between photodiodes, within the signal processing circuit, between the photodiodes and the signal processing circuit, and the like.

On a top face of the P-type silicon substrate 10 in which the photodiodes and other elements have been formed, an insulating film 61 having contact holes is formed. Through the contact holes, electrodes 62 formed on a top face of the P$^+$-type well layer 13 are electrically connected to the P$^+$-type well layer 13. Electrodes 63 are formed on a top face of the N-type well layer 11 and electrically connected to the N-type well layer 11 through the contact holes. In the semiconductor photodetector element 100 according to the first embodiment, independent electrodes are pulled out to the surface of not only the P$^+$-type well layer 13 (P-type well layer 12) and the N-type well layer 11 but also the P-type silicon substrate 10 and the N-type semiconductor layer 14. This makes it possible to vary electric potentials from layer to layer independently of one another. This also makes it possible to initialize electric charges that have accumulated in a photodiode immediately before the photodiode is irradiated with light.

A wiring layer (not shown) for connecting elements to one another is also formed on the top face of the P-type silicon substrate 10. The wiring layer is made of, for example, AlCu or AlSi. A light shielding mask (not shown) is formed, above the signal processing circuit, which includes the arithmetic circuit portion 50, and above other components, of the same material as the wiring layer in order to prevent malfunction caused by the incidence of light. The light shielding mask (not shown) is also formed above other regions of the first photodiode 20 and the second photodiode 30 than their light receiving faces.

A cover film 65 is formed on a top face of the insulating film 61, and a leveling film 66 is formed on a top face of the cover film 65. The cover film 65 is desirably removed from only above the photodiodes in order to prevent surface reflection fluctuations which are caused by thickness fluctuations of the insulating film 61.

In the semiconductor photodetector element 100 according to the first embodiment, a color filter layer 21 is formed on the light receiving face (on the leveling film 66) of the first photodiode 20. The color filter layer 21 is formed of a green filter (organic color filter) which transmits green light in a manner that covers the light receiving face of the first photodiode 20. A color filter layer 31 is formed on the light receiving face (on the leveling film 66) of the second photodiode 30. The color filter layer 31 is formed of a black filter (organic color filter) which blocks visible light in a manner that covers the light receiving face of the second photodiode 30. The color filter layers 21 and 31 each have a thickness of approximately 1.4 μm. The color filter layer 21 is an example of a "first filter" of the present invention, and the color filter layer 31 is an example of a "second filter" of the present invention.

Figure 3:
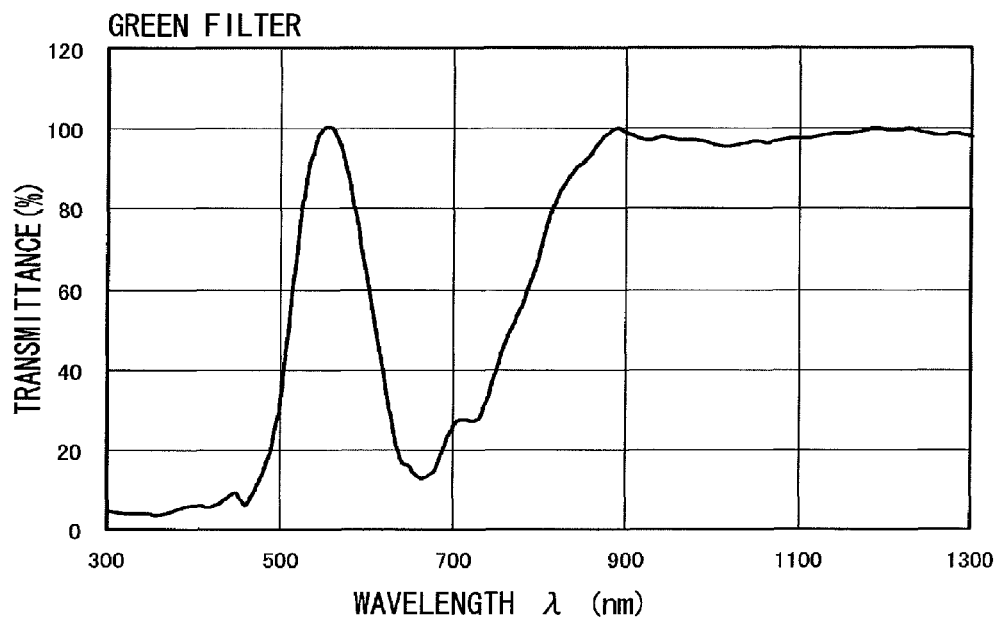
FIG. 3 is a graph showing a spectral transmittance curve of a color filter layer (green filter) of the semiconductor photodetector element according to the first embodiment of the present invention.

As shown in FIG. 3, the color filter layer 21 formed of a green filter is, in the visible light range, a band path filter having a relatively gentle curve which transmits green range light whereas, in a wavelength range of 650 nm and above, the color filter layer 21 exhibits such characteristics that the transmittance rises as the wavelength lengthens. The color filter layer 21 has a transmittance peak at substantially the same wavelength as the peak (peak wavelength: 555 nm) of a relative visibility spectrum shown in FIG. 10 and, in a wavelength range of 450 nm to 650 nm, exhibits favorable filtering characteristics which practically match the relative visibility. The color filter layer 21 formed of a green filter also transmits long wavelength (700 nm and above) light.

Figure 4:
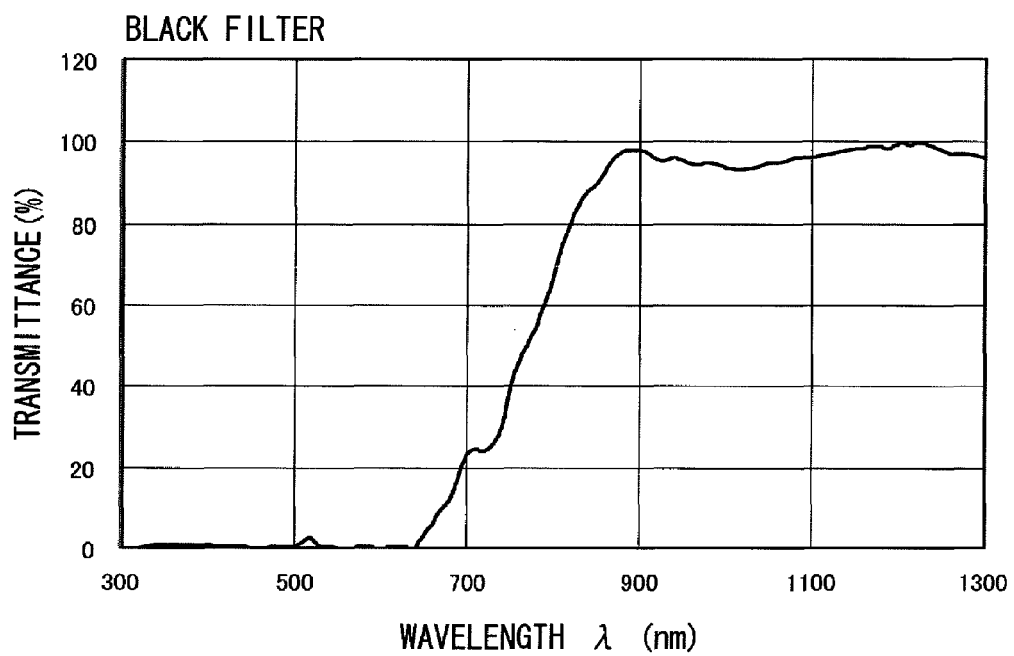
FIG. 4 is a graph showing a spectral transmittance curve of another color filter layer (black filter) of the semiconductor photodetector element according to the first embodiment of the present invention.

The color filter layer 31 formed of a black filter, on the other hand, does not transmit visible range light but transmits long wavelength (700 nm and above) light as shown in FIG. 4. In other words, the color filter layer 31 transmits infrared light but blocks visible light. The transmittance of long wavelength (700 nm and above) light in the color filter layer 31 practically matches the transmittance of long wavelength (700 nm and above) light in the color filter layer 21, which is formed of a green filter. A black filter that has those characteristics is obtained by, for example, mixing a dye/pigment component that constitutes a green filter (in the same amount as in the green filter) and a dye/pigment component that constitutes a red filter (in the same amount as in the red filter). In the case where the color filter layer 21 (green filter) and the color filter layer 31 (black filter) do not have the same transmittance with respect to long wavelength (700 nm and above) light, the transmission spectrum of the color filter layer 21 on the long wavelength side (700 nm and above) and the transmission spectrum of the color filter layer 31 on the long wavelength side (700 nm and above) can be made equal to each other by adjusting the thicknesses of the color filter layer 21 and the color filter layer 31 suitably.

Figure 5:
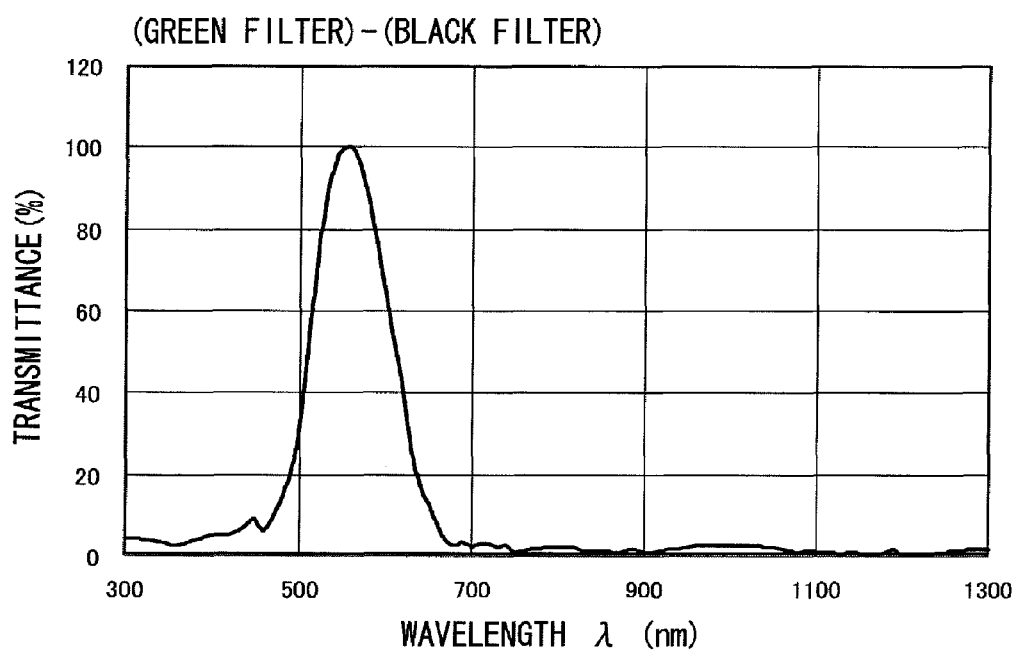
FIG. 5 is a graph showing a spectral transmittance curve that is obtained from a difference between the spectral transmittance curve of the green filter and the spectral transmittance curve of the black filter in the first embodiment.

A difference between the filter characteristics of the green filter which are shown in FIG. 3 and the filter characteristics of the black filter which are shown in FIG. 4 is calculated to obtain filter characteristics of FIG. 5 which have the transmittance peak at substantially the same wavelength as the peak (peak wavelength: 555 nm) of the relative visibility spectrum and which block long wavelength light (infrared light). Desirably, a spectral sensitivity waveform obtained from the difference practically matches the waveform of the relative visibility.

In the semiconductor photodetector element 100 according to the first embodiment, the first photodiode 20 and the second photodiode 30 both have a common cathode, and are structured such that detection signals of the first photodiode 20 and the second photodiode 30 are taken out of the $P^+$-type well layer 13 (P-type well layer 12).

In the first embodiment, the semiconductor photodetector element 100 includes an illuminance sensor portion 22 for detecting the brightness of the surroundings, and a proximity sensor portion 32 for detecting the distance from a target. The illuminance sensor portion 22 is structured to include the first photodiode 20 and the color filter layer 21. The proximity sensor portion 32 is structured to include the second photodiode 30 and the color filter layer 31. The proximity sensor portion 32 constitutes, together with an LED described later, a proximity sensor. The illuminance sensor portion 22 is an example of a "first sensor portion" of the present invention, and the proximity sensor portion 32 is an example of a "second sensor portion" of the present invention.

Figure 6:
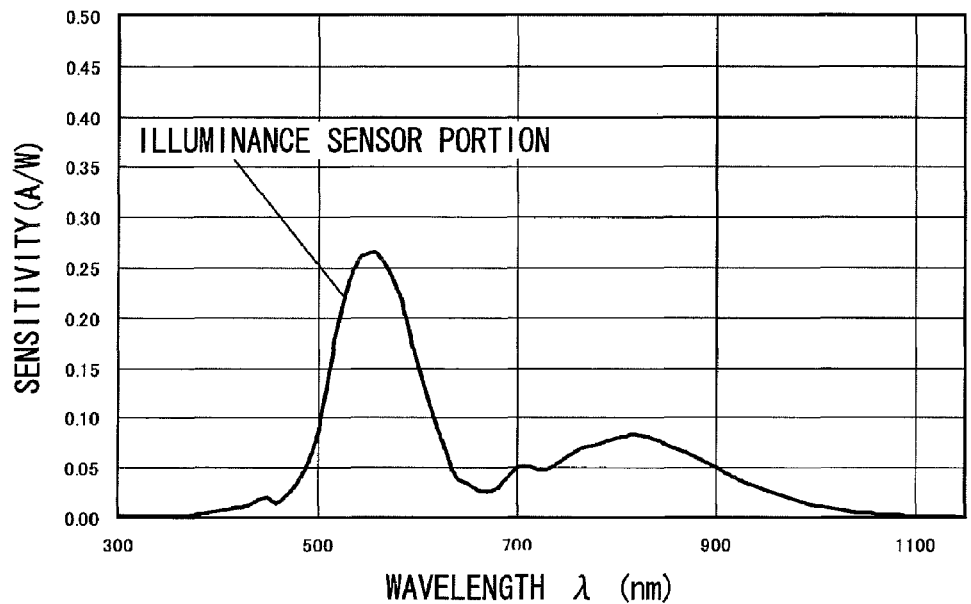
FIG. 6 is a graph showing a relation between sensitivity of a first photodiode (illuminance sensor portion) and light wavelength in the first embodiment.
Figure 7:
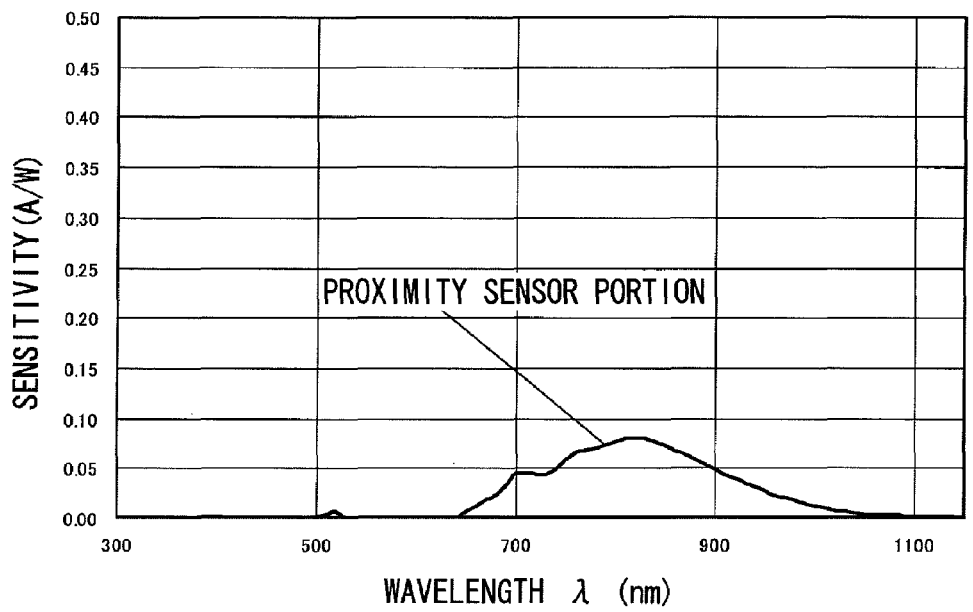
FIG. 7 is a graph showing a relation between sensitivity of a second photodiode (proximity sensor portion) and the light wavelength in the first embodiment.
Figure 8:
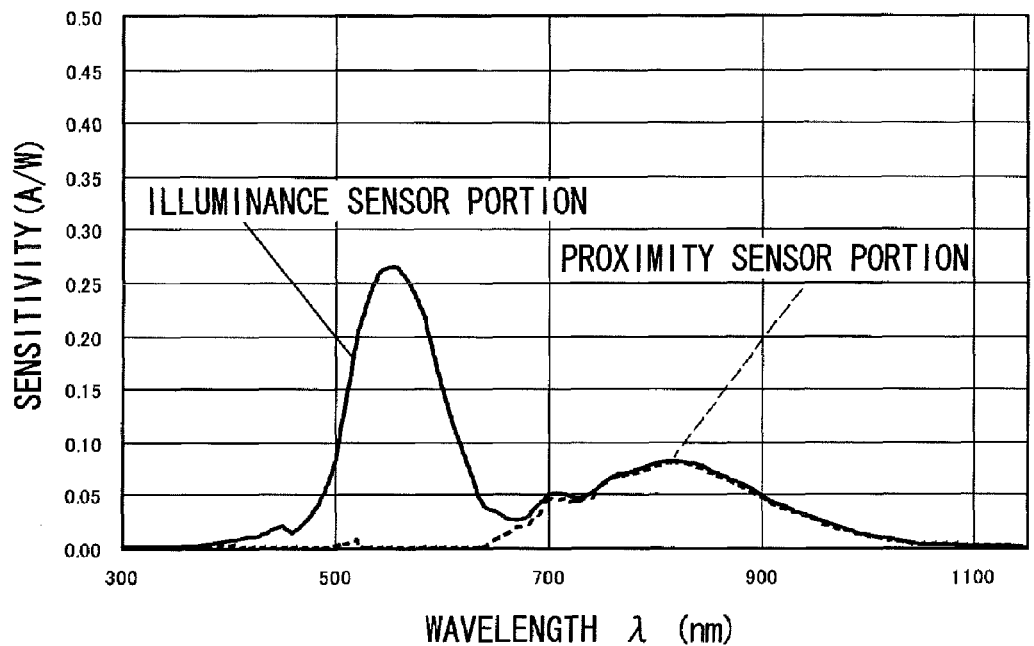
FIG. 8 is a graph showing a spectral sensitivity curve of the first photodiode (illuminance sensor portion) and a spectral sensitivity curve of the second photodiode (proximity sensor portion) in the first embodiment which are overlaid with each other.

In the first embodiment, because of the color filter layer 21 formed of a green filter, the illuminance sensor portion 22 (first photodiode 20) has spectral sensitivity characteristics shown in FIG. 6 which have the peak sensitivity in a wavelength range of 450 nm to 650 nm (visible light range, here, referred to as first wavelength range) and have sensitivity in a wavelength range of 700 nm and above (near-infrared range, here, referred to as second wavelength range) as well. The proximity sensor portion 32 (second photodiode 30) has, because of the color filter layer 31 formed of a black filter, spectral sensitivity characteristics shown in FIG. 7 which give the proximity sensor portion 32 sensitivity to light in a wavelength range of 700 nm and above (near-infrared range, here, referred to as third wavelength range). The proximity sensor portion 32 in the first embodiment is structured to have the peak around 830 nm, on the premise that an infrared light emitting diode element with a light emission peak wavelength of 830 nm is used as a light emitting diode element for the proximity sensor.

By giving the first photodiode 20 and the second photodiode 30 the same structure and giving the color filter layer 21 and the color filter layer 31 transmittances for long wavelength (700 nm and above) light that practically match, the spectral sensitivity of the illuminance sensor portion 22 (first photodiode 20) on the long wavelength side (700 nm and above) and the spectral sensitivity of the proximity sensor portion 32 (second photodiode 30) on the long wavelength side (700 nm and above) are made practically equal to each other.

Figure 9:
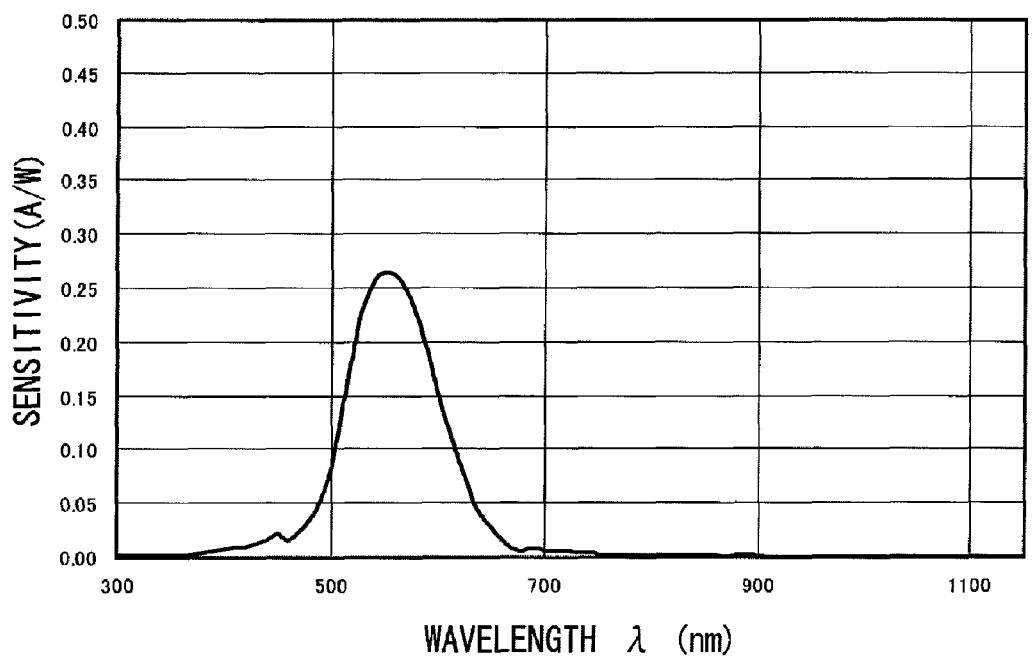
FIG. 9 is a graph showing a spectral sensitivity curve that is obtained by subtracting the spectral sensitivity curve (detection signal) of the second photodiode (proximity sensor portion) from the spectral sensitivity curve (detection signal) of the first photodiode (illuminance sensor portion)
Figure 10:
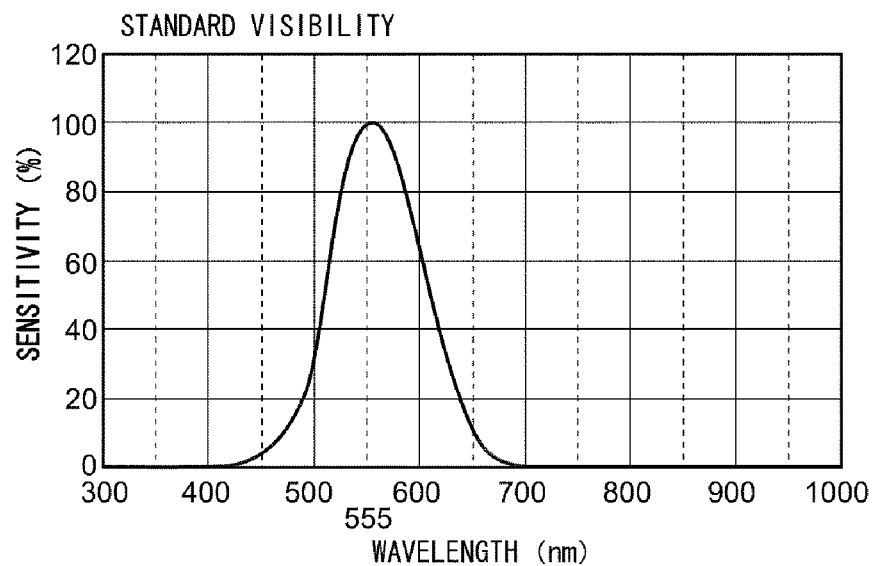
FIG. 10 is a graph showing spectrum distribution of human relative visibility characteristics.

Therefore, subtracting a detection signal that is detected by the proximity sensor portion 32 (second photodiode 30) from a detection signal that is detected by the illuminance sensor portion 22 (first photodiode 20) in the arithmetic circuit portion 50 yields sensitivity characteristics shown in FIG. 9 which are sufficiently reduced in sensitivity to infrared light to be equivalent to the human visibility characteristics. An illuminance sensor having wavelength sensitivity characteristics equivalent to the human visibility characteristics is thus obtained. The expression "practically equal to each other" used in the above comprehends, for example, a state in which the sensitivity to light in a wavelength range of 700 nm and above after the subtraction processing is 10% or less of the peak sensitivity in a wavelength range of 450 nm to 650 nm.

Figure 11:
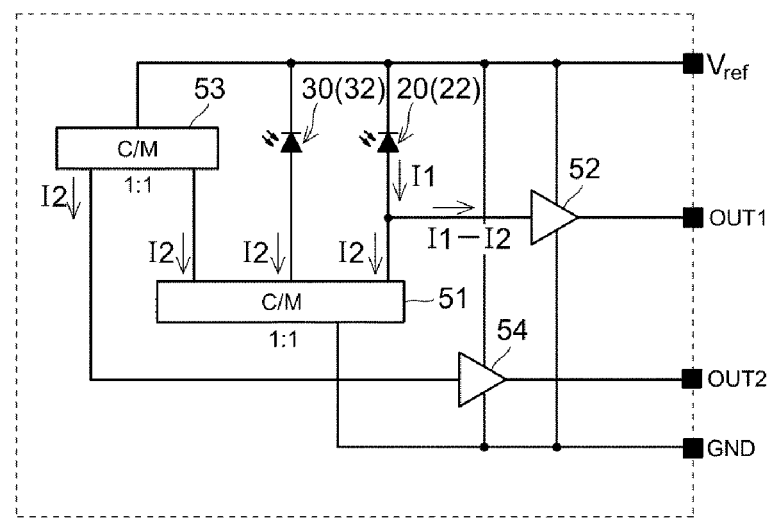
FIG. 11 is a circuit diagram illustrating a structure of an arithmetic circuit portion of the semiconductor photodetector element according to the first embodiment of the present invention.

The arithmetic circuit portion 50 takes, for example, a circuit structure illustrated in FIG. 11. In this circuit structure, an anode terminal of the first photodiode 20 which constitutes part of the illuminance sensor portion 22 is connected to an output of a current mirror circuit 51, and also connected to the input side of a current amplifier 52. A cathode terminal of the first photodiode 20 is connected to a constant voltage source terminal Vref. The output side of the current amplifier 52 is connected to an illuminance sensor-use output terminal OUT1. On the other hand, the second photodiode 30 which constitutes part of the proximity sensor portion 32 has an anode terminal connected to an input of the current mirror circuit 51, and a cathode terminal connected to the constant voltage source terminal Vref. The current mirror circuit 51 is also connected to a current mirror circuit 53, which is connected to the input side of a current amplifier 54. The output side of the current amplifier 54 is connected to a proximity sensor-use output terminal OUT2. The current mirror circuits 51 and 53 are set to an amplification rate of 100%.

Figure 12:
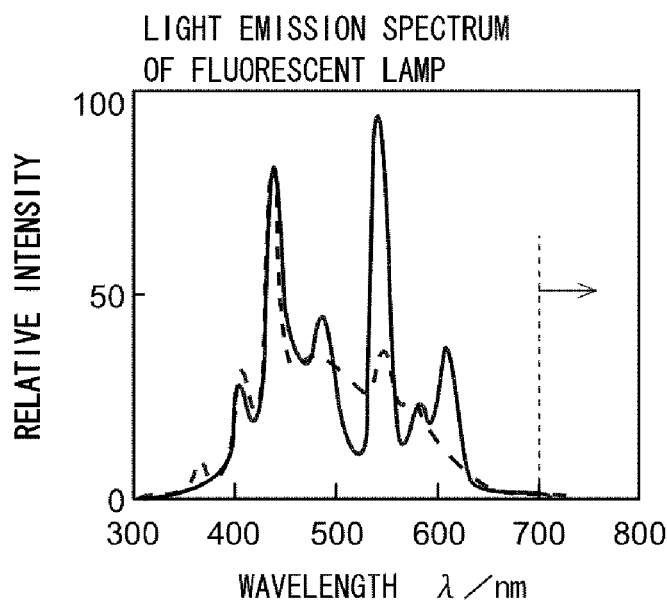
FIG. 12 is a graph showing a typical light emission spectrum distribution of a fluorescent tube for illumination uses.
Figure 13:
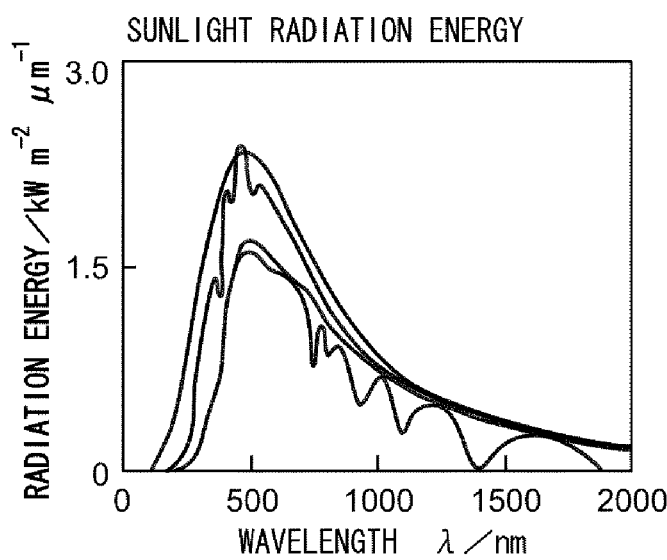
FIG. 13 is a graph showing the light emission spectrum distribution of sunlight.
Figure 14:
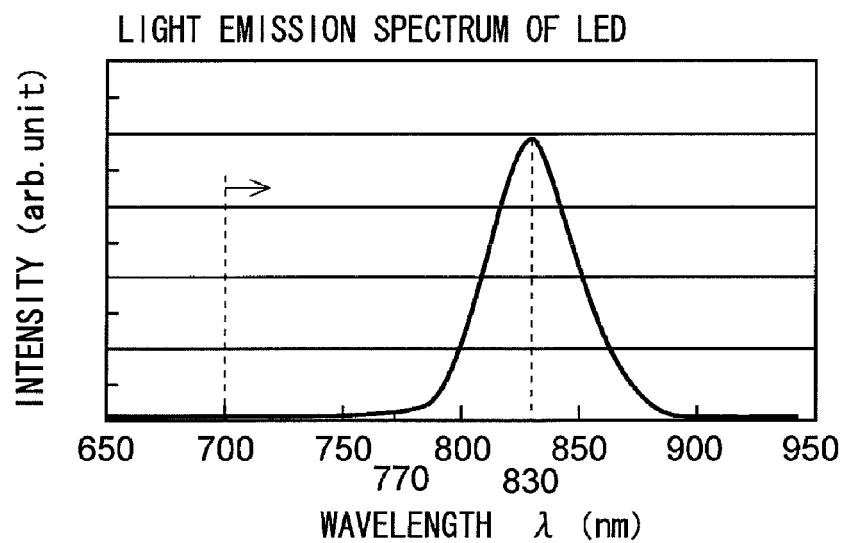
FIG. 14 is a graph showing a typical light emission spectrum distribution of an LED that emits near-infrared light having a wavelength of 830 nm.

The operation of the semiconductor photodetector element 100 according to the first embodiment is described next with reference to FIGS. 1, 4, and 7 and FIGS. 11 to 14. FIG. 12 is a graph showing a typical light emission spectrum distribution of a fluorescent tube for illumination uses. FIG. 13 is a graph showing the light emission spectrum distribution of sunlight. FIG. 14 is a graph showing a typical light emission spectrum distribution of an LED that emits near-infrared light having a wavelength of 830 nm.

First, the P-type silicon substrate 10 and the P-type well layer 12 ($P^+$-type well layer 13) are set to a ground potential and, in this state, a constant voltage Vref is applied to the N-type well layer 11, to thereby apply a reverse bias voltage (for example, +0.7 V) to the first photodiode 20 and the second photodiode 30. Initialization which minimizes the number of electrons in the N-type well layer 11 is thus accomplished. A reverse bias voltage that is applied to the photodiodes 20 and 30 upon reception of light is set to 0 V to obtain an effect of reducing dark current.

After that, when the semiconductor photodetector element 100 is irradiated with light, the irradiating light enters the first photodiode 20 (illuminance sensor portion 22) and the second photodiode 30 (proximity sensor portion 32). This generates photocarriers in the P-type well layer 12 and the N-type well layer 11, and the photocarriers are detected as a photoelectric current.

As described above, photodiodes have sensitivity to invisible light such as infrared light in addition to visible light whereas the human eye is sensitive to light in the visible light range. A photodiode therefore needs to have as low sensitivity to infrared light as possible to function as an illuminance sensor.

A fluorescent lamp commonly used for indoor illumination emits light only in a wavelength range of 300 nm to 700 nm as shown in FIG. 12, and hence hardly poses the problem of infrared light. As shown in FIG. 13, sunlight, on the other hand, has the light emission peak at 500 nm, which is close to the wavelength of green, and its light emission intensity is observed also in a near-infrared range of 750 nm and above, although the light emission intensity decreases as the wavelength lengthens. Thus, depending on the type of irradiating light, light in a long wavelength range of 700 nm and above sometimes enters the first photodiode 20 (illuminance sensor portion 22) and the second photodiode 30 (proximity sensor portion 32).

When an LED that has the light emission peak wavelength at 830 nm is used as an LED for the proximity sensor, the light emission spectrum of the LED is as shown in FIG. 14: the distribution curve is steep on each side of the wavelength at which the light emission intensity is maximum, and the half-value width thereof is about 50 nm. The tail of the curve on the short wavelength side starts at approximately 770 nm.

In the semiconductor photodetector element 100 according to the first embodiment, when irradiating light contains infrared light, the color filter layers 21 and 31 which are formed of organic color filters transmit the infrared light, and hence the infrared light enters the first photodiode 20 (illuminance sensor portion 22) and the second photodiode 30 (proximity sensor portion 32) alike.

The color filter layer 31 formed of a black filter transmits infrared light but blocks visible light as shown in FIG. 4. The proximity sensor portion 32 therefore has the spectral sensitivity characteristics of FIG. 7 that have sensitivity to light in a wavelength range of 700 nm and above (near-infrared range).

Upon detection of a photoelectric current by the illuminance sensor portion 22 (first photodiode 20) and the proximity sensor portion 32 (second photodiode 30), the arithmetic circuit portion 50 (see FIG. 1) performs subtraction processing in which a detection signal detected by the proximity sensor portion 32 (second photodiode 30) is subtracted from a detection signal detected by the illuminance sensor portion 22 (first photodiode 20). Specifically, as illustrated in FIG. 11, the current mirror circuit 51 subtracts a detection signal detected by the second photodiode 30 from a detection signal detected by the first photodiode 20. The minuend detection signal after the subtraction is amplified by the current amplifier 52 and output from the output terminal OUT1 as a signal for the illuminance sensor. This enables the illuminance sensor portion 22 to function as an illuminance sensor that is sufficiently lowered in sensitivity to infrared light to have sensitivity characteristics equivalent to the human visibility characteristics.

The detection signal detected by the proximity sensor portion 32 (second photodiode 30) is amplified by the current amplifier 54 and output from the output terminal OUT2 as a signal for the proximity sensor. This enables the proximity sensor portion 32 to function as a proximity sensor which detects whether a target is in close proximity or not. In order to distinguish near-infrared light emitted by the LED for the proximity sensor from near-infrared light that is contained in ambient light, one way is to cause the LED to emit pulsating light.

FIGS. 15 to 21 are sectional views illustrating a manufacturing method for the semiconductor photodetector element according to the first embodiment of the present invention. A manufacturing method for the semiconductor photodetector element 100 according to the first embodiment of the present invention is described next with reference to FIGS. 15 to 21. The manufacturing method for the semiconductor photodetector element 100 follows a process similar to the CMOS process.

Figure 15:
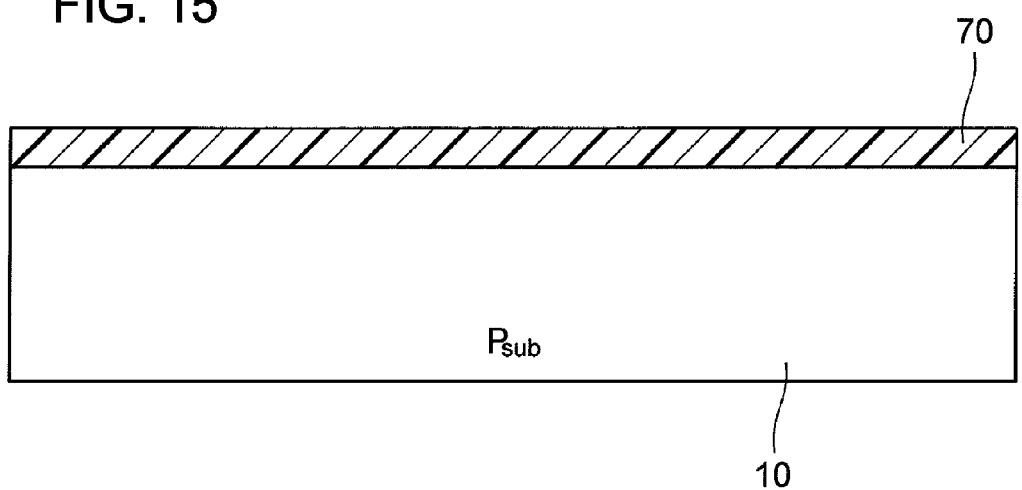
FIG. 15 is a sectional view illustrating a manufacturing method for the semiconductor photodetector element according to the first embodiment of the present invention.
Figure 16:
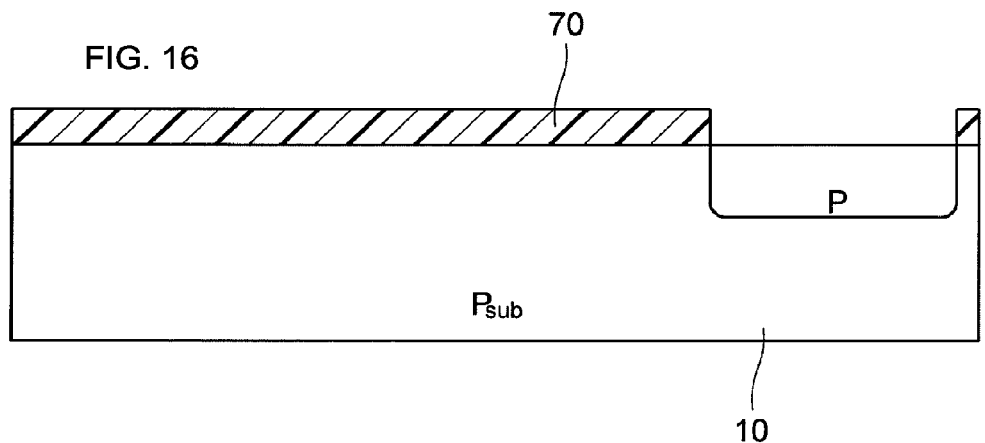
FIG. 16 is a sectional view illustrating the manufacturing method for the semiconductor photodetector element according to the first embodiment of the present invention.

First, as illustrated in FIG. 15, a coat of a photo resist 70 is formed to a thickness of approximately 2 μm, which is thicker than normal, on the entire top face of the P-type silicon substrate 10, which has a relatively low impurity concentration (for example, about $1 \times 10^{15}$ cm$^{-3}$). Next, as illustrated in FIG. 16, the resist 70 is removed by photolithography or the like from above a region that is to serve as the arithmetic circuit portion 50 (see FIG. 1). The resist 70 is then used as a mask for ion implantation in which boron ions are implanted as P-type impurities in the P-type silicon substrate 10 under conditions including setting the acceleration energy to 150 KeV and the implantation amount to $5 \times 10^{12}$ cm$^{-2}$. The boron impurities are introduced to a depth of approximately 0.4 µm from the surface of the P-type silicon substrate 10. After that, the resist 70 is removed with the use of oxygen plasma.

Figure 17:
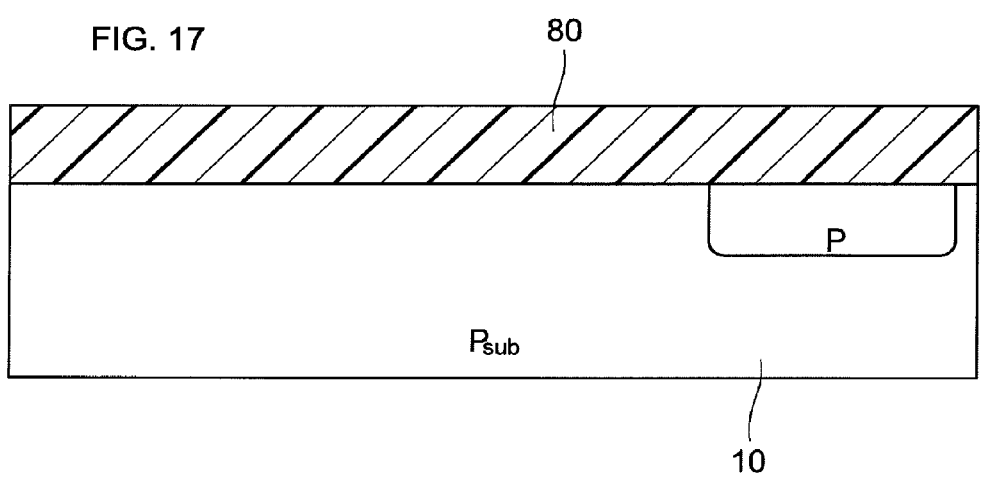
FIG. 17 is a sectional view illustrating the manufacturing method for the semiconductor photodetector element according to the first embodiment of the present invention.
Figure 18:
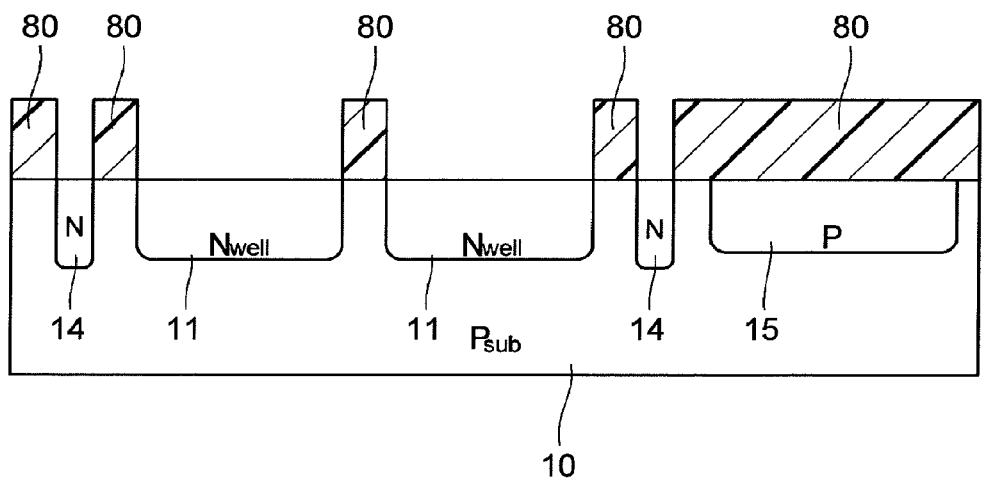
FIG. 18 is a sectional view illustrating the manufacturing method for the semiconductor photodetector element according to the first embodiment of the present invention.

Subsequently, a thick coat of resist 80 is formed to a thickness of about 5 µm on the entire top face of the P-type silicon substrate 10 as illustrated in FIG. 17. Next, as illustrated in FIG. 18, the resist 80 is removed by photolithography or the like from above regions where the first photodiode 20 (see FIG. 1), the second photodiode 30 (see FIG. 1), and the third photodiode 40 (see FIG. 1) are to be formed. The resist 80 is then used as a mask for ion implantation in which phosphorus ions are implanted as N-type impurities in the P-type silicon substrate 10 under conditions including setting the acceleration energy to 3 MeV and the implantation amount to $1 \times 10^{13}$ cm$^{-2}$. The phosphorus impurities are introduced to a depth of approximately 2.5 µm from the surface of the P-type silicon substrate 10.

The resist 80 is formed to a thickness approximately five times larger than the thickness of a normally used resist which is about 1 µm. This is because the implantation energy is set here to a very high level for phosphorus ions, and the phosphorus ions need to be prevented from reaching the P-type silicon substrate 10 past the resist and being implanted in other regions than the intended implantation regions.

After that, the resist 80 is removed with the use of oxygen plasma. A washing step is executed and then high-temperature, long-hour annealing treatment is performed at 1,100° C. for about half a day (approximately twelve hours). The N-type well layer 11 having a depth of approximately 7 µm to 10 µm and the P-type semiconductor layer 15 having a depth of approximately 7 µm to 10 µm are formed as a result. The N-type semiconductor layer 14 which constitutes part of the third photodiode 40 (see FIG. 1) is formed to have the same depth as the N-type well layer 11. Ion implantation for forming the N-type semiconductor layer 14 may be performed separately from ion implantation for forming the N-type well layer 11 to give the N-type semiconductor layer 14 a depth (thickness) larger than that of the N-type well layer 11.

Figure 19:
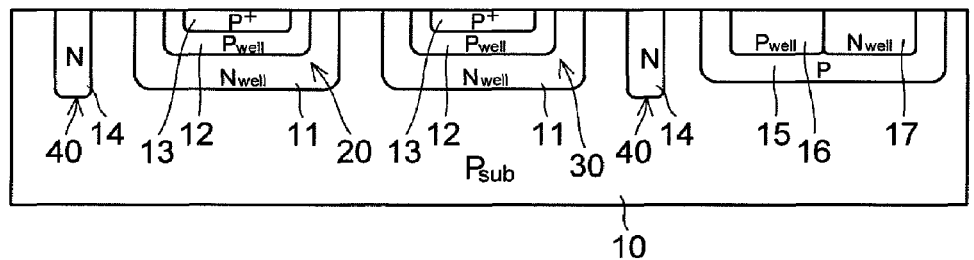
FIG. 19 is a sectional view illustrating the manufacturing method for the semiconductor photodetector element according to the first embodiment of the present invention.

Next, as illustrated in FIG. 19, the P-type well region 16 and the N-type well region 17 are formed in the region where the arithmetic circuit portion 50 (see FIG. 1) is to be formed (P-type semiconductor layer 15). At the same time, the P-type well layer 12 is formed in the regions where the photodiodes are to be formed (N-type well layer 11).

Though not shown in the drawings, the selective oxidization film is formed to isolate elements through electrical insulation between photodiodes, within the signal processing circuit, between the photodiodes and the signal processing circuit, and the like. The gate insulating film constituting a transistor is formed next, and then the gate electrode using polysilicon is formed, which is followed by the formation of the diffusion layer to serve as a source and a drain of the transistor.

In the step of forming the source and the drain, the heavily doped P$^+$-type well layer 13 is formed. The first photodiode 20 and the second photodiode 30 which have the same structure are thus formed in the P-type silicon substrate 10.

The impurity concentration and depth of the N-type semiconductor layer and the P-type semiconductor layer greatly influence the sensitivity spectrum of the resultant photodiodes, and are therefore optimized to accomplish the objective performance (in terms of sensitivity spectrum, for example).

Figure 20:
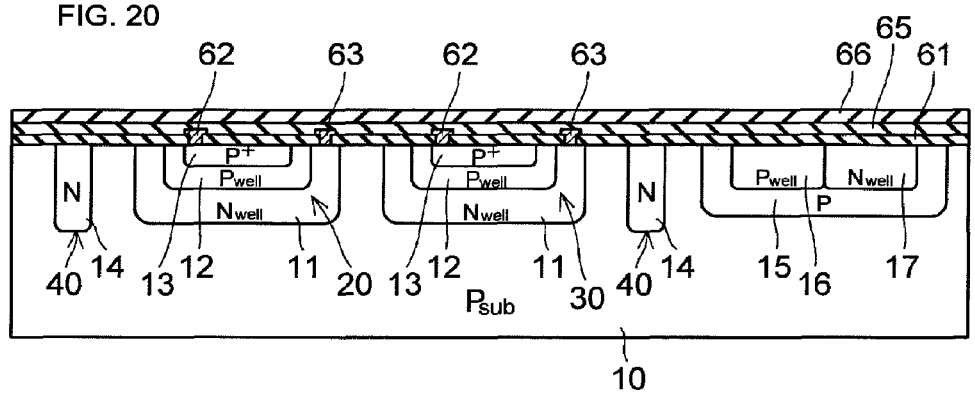
FIG. 20 is a sectional view illustrating the manufacturing method for the semiconductor photodetector element according to the first embodiment of the present invention.

Next, as illustrated in FIG. 20, an oxide film is formed as the insulating film 61 on the top face of the P-type silicon substrate 10 in which the elements have been formed. Contact holes are formed in given regions of the insulating film 61. A metal layer is formed next on the top face of the insulating film 61, and patterned by photolithography and etching or the like to form the electrodes 62 and 63.

In the manufacturing method for the semiconductor photodetector element 100 according to the first embodiment, independent electrodes are formed on the surface for the respective layers including the P-type silicon substrate 10 and the N-type semiconductor layer 14, so that the electric potential can be varied from layer to layer independently of one another. The wiring layer (not shown) for connecting elements to one another is formed on the top face of the P-type silicon substrate 10. The light shielding mask (not shown) is formed above the signal processing circuit, which includes the arithmetic circuit portion 50, and above other components formed of the same material that is used for the wiring layer. The light shielding mask (not shown) is also formed above other regions of the first photodiode 20 and the second photodiode 30 than their light receiving faces.

After that, a silicon nitride film is formed as the cover film 65 on the top face of the insulating film 61, and the leveling film 66 is formed of an organic material on the top face of the cover film 65. In this case, the cover film 65 is preferred to be removed from above the photodiodes 20 and 30. This leaves only the oxide film as the inorganic material film located above the photodiodes, which is effective in preventing fluctuations in light reflection above the photodiodes.

Figure 21:
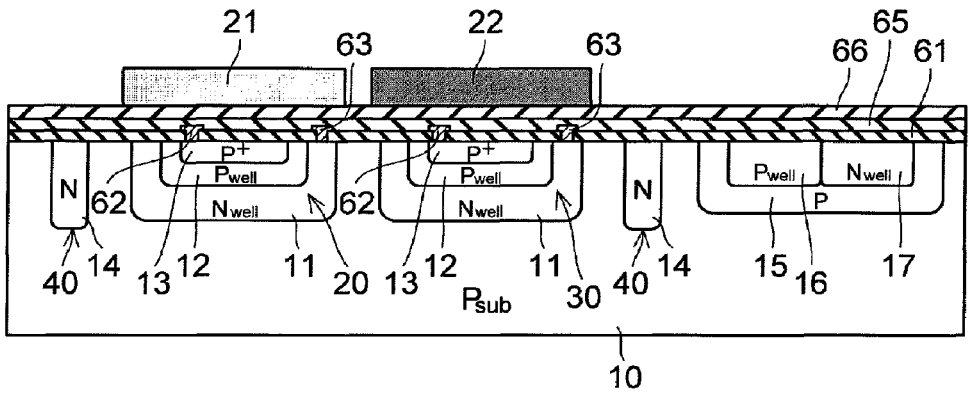
FIG. 21 is a sectional view illustrating the manufacturing method for the semiconductor photodetector element according to the first embodiment of the present invention.

Lastly, as illustrated in FIG. 21, the color filter layer 21 is formed of a green filter on the top face above the first photodiode 20 and the color filter layer 31 is formed of a black filter on the top face above the second photodiode 30.

The semiconductor photodetector element 100 according to the first embodiment is formed in this manner.

In the first embodiment, as described above, the color filter layer 21 (green filter), which transmits light in a visible light range of 450 nm to 650 nm and light in an infrared range of 700 nm and above (infrared light) as well, is formed above the first photodiode 20, and the color filter layer 31 (black filter), which transmits light in an infrared range of 700 nm and above (infrared light), is formed above the second photodiode 30. As a result, the first photodiode 20 detects light in a visible light range of 450 nm to 650 nm and light in an infrared range of 700 nm and above, whereas the second photodiode 30 detects light in an infrared range of 700 nm and above. The arithmetic circuit portion 50 subtracts a detection signal of the second photodiode 30 from a detection signal of the first photodiode 20, thereby lowering the sensitivity to light in an infrared range of 700 nm and above (infrared light). The influence of infrared light is thus eliminated, and hence an illuminance sensor having wavelength sensitivity characteristics close to the human visibility characteristics is obtained.

In the first embodiment, forming the color filter layer 31 (black filter) above the second photodiode 30 enables the second photodiode 30 to detect light in an infrared range of 700 nm and above (infrared light). The second photodiode 30 (proximity sensor portion 32) can therefore be used also as a light receiving element that detects light from an LED that emits near-infrared light. In other words, the second photodiode 30 can be used as a light receiving element of a proximity sensor (ranging sensor) as well. An illuminance sensor and a proximity sensor (ranging sensor) can thus be formed on a single chip. With an illuminance sensor and a proximity sensor (ranging sensor) formed on a single chip, the packaging size of the semiconductor photodetector element is reduced and a package (semiconductor device) to which the semiconductor photodetector element is mounted is accordingly reduced in size.

In the first embodiment, where the color filter layers 21 and 31 are formed above the first photodiode 20 and the second photodiode 30, respectively, there is no need for interference filter films, which are expensive, and the manufacturing cost is lowered that much.

In the first embodiment, where the first photodiode 20 and the second photodiode 30 are given the same structure, fluctuations in impurity profile and the like between the first photodiode 20 and the second photodiode 30 are reduced, and the sensitivity fluctuations between the first photodiode 20 and the second photodiode 30 is accordingly smaller. In other words, the sensitivity characteristics of the first photodiode 20 and the sensitivity characteristics of the second photodiode 30 are made equal to each other. This means that the sensitivity to infrared light is lowered sufficiently by simply subtracting a detection signal of the second photodiode 30 from a detection signal of the first photodiode 20, without multiplying the detection signal of the second photodiode 30 by a given number. The influence of infrared light is thus eliminated effectively, and hence a semiconductor photodetector element that has high precision is obtained.

In the first embodiment, where the first photodiode 20 and the second photodiode 30 are formed in the same P-type silicon substrate 10, light incident on the first photodiode 20 enters the second photodiode 30 in the same manner, with the result that the influence of infrared light is eliminated effectively by subtracting a detection signal of the second photodiode 30 from a detection signal of the first photodiode 20. This means that the influence of infrared light is eliminated and prevented from causing malfunction even when forming a proximity sensor and an illuminance sensor on the same chip lets infrared light incident on the second photodiode 30 enter the first photodiode 20. The reliability is improved as a result.

Structured as above, the semiconductor photodetector element 100 allows light to enter the first photodiode 20 and the second photodiode 30 in the same manner. Ambient light or other light irradiating the semiconductor photodetector element 100 is thus incident on the first photodiode 20 and on the second photodiode 30 alike. Then the influence of incident ambient light or the like is eliminated by subtracting a detection signal of the second photodiode 30 from a detection signal of the first photodiode 20.

Structured as above, the semiconductor photodetector element 100 does not need a light shielding wall or the like formed between the first photodiode 20 and the second photodiode 30 to block infrared light. This, too, contributes to a reduction in manufacturing cost and a reduction in package size (semiconductor device size).

In the first embodiment, the color filter layers 21 and 31 make the spectral sensitivity characteristics of the first photodiode 20 and the spectral sensitivity characteristics of the second photodiode 30 practically equal to each other in a wavelength range of 700 nm and above. The sensitivity to light in a long wavelength range of 700 nm and above is thus lowered more sufficiently and an illuminance sensor from which the influence of infrared light is eliminated more thoroughly is obtained. The expression "practically equal to each other" used in the above comprehends, for example, a state in which the sensitivity to light in a wavelength range of 700 nm and above after the subtraction processing is 10% or less of the peak sensitivity in a wavelength range of 450 nm to 650 nm.

In the first embodiment, by using a green filter and a black filter as the color filter layer 21 and the color filter layer 31, respectively, the color filter layer 21 and the color filter layer 31 can be formed by a method that is commonly used in the back-end process, which makes it easy to form the color filter layer 21 and the color filter layer 31 above the first photodiode 20 and the second photodiode 30, respectively. The manufacturing cost is thus reduced with ease.

In the first embodiment, where the color filter layer 21 is a green filter, which transmits visible light and infrared light, and the color filter layer 31 is a black filter, which blocks visible light but transmits infrared light, it is easy to form a filter that transmits light in a wavelength range of 450 nm to 650 nm (visible light) as well as light in a wavelength range of 700 nm and above (infrared light) (color filter layer 21) and a filter that transmits light in a wavelength range of 700 nm and above (infrared light) (color filter layer 31).

Forming a green filter above the first photodiode 20 gives the first photodiode 20 sensitivity characteristics substantially equal to the human visibility characteristics in the visible light range. On the other hand, a green filter and a black filter which are organic filters both transmit infrared light. The sensitivity to light in a long wavelength range of 700 nm and above is therefore lowered further by subtracting a detection signal of the second photodiode 30 above which a black filter is formed from a detection signal of the first photodiode 20 above which a green filter is formed. A sensor (illuminance sensor) that has wavelength sensitivity characteristics even closer to the human visibility characteristics is obtained as a result.

In the first embodiment, where the first photodiode 20 constituting part of the illuminance sensor portion 22 and the second photodiode 30 constituting part of the proximity sensor portion 32 both have a common cathode, the first photodiode 20 and the second photodiode 30 can be constituted of PN junctions between the N-type well layer 11 and the P-type well layer 12. This way, unlike the case where the first photodiode 20 and the second photodiode 30 are constituted of PN junctions between the P-type silicon substrate 10 and the N-type well layer 11, fluctuations in the denuded zone (DZ) of the P-type silicon substrate 10 are prevented from causing sensitivity fluctuations.

In the first embodiment, where the N-type well layer 11 is formed to the thickness d1, which is 7 μm or more and 10 μm or less, the absorption of long wavelength light in the N-type well layer 11 is reduced because different wavelengths have different penetration lengths, and the sensitivity to long wavelength light is accordingly lowered. The sensitivity to infrared light is lowered more sufficiently by subtracting a detection signal of the second photodiode 30 from a detection signal of the first photodiode 20 while keeping the sensitivity to long wavelength light low.

The proximity sensor employs, for example, an LED having a wavelength of 830 nm which is common as an infrared light emitting diode. An absorption coefficient $\alpha(\lambda)$ at which this light is absorbed in a silicon substrate is approximately $\frac{1}{10}\ \mu m^{-1}$. When the intensity of light entering the photodiode is given as $I(0, \lambda)$, a light intensity $I(d, \lambda)$ at a depth d from the silicon surface is expressed by the following Expression (1).

$$I(d,\lambda)=I(0,\lambda)\cdot\exp(-d/\alpha(\lambda)) \qquad (1)$$

Expression (1) can be transformed to obtain a penetration depth d at which the light intensity is I(d, λ) from the attenuated light intensity and from the absorption coefficient as indicated by the following Expression (2).

$$d = \ln(I(0,\lambda)/I(d,\lambda)) \cdot \alpha(\lambda) \quad (2)$$

For example, when incident light attenuates by half (I(d, λ)/I(0, λ)=0.5), the penetration depth of the incident light is approximately 7 μm. Therefore, in order to detect a half or more of incident infrared light having a wavelength of 830 nm, the sensor sensitive to infrared light (proximity sensor portion 32) is preferred to be formed to have a depth of approximately 7 μm or more as described above. This way, the sensor can also detect, with high sensitivity, light from an LED that has the light emission peak wavelength at 830 nm. Silicon substrates contain oxygen bulk micro defects (BMDs) caused by oxygen aggregation, and the BMDs are usually found at a depth of 10 μm or deeper. Setting the depth of the N-type well layer 11 to 10 μm or less prevents sensitivity fluctuations caused by oxygen BMDs, and also reduces the incidence of infrared light to make an infrared signal practically small in the subtraction and thereby raise the precision of a visible light signal obtained as a subtraction result.

In the first embodiment, the color filter layers 21 and 31 are each made from a single film, which simplifies the manufacture process and contributes to the reduction of the manufacturing cost.

In the first embodiment, the third photodiode 40 is formed in the P-type silicon substrate 10 so as to frame the first photodiode 20 and the second photodiode 30 in plan view. This enables the third photodiode 40 to capture excess carriers generated by the incidence of light on other regions than the light receiving faces of the first photodiode 20 and the second photodiode 30. A photoelectric current generated in other regions than the first photodiode 20 and the second photodiode 30 is thus removed, which improves the precision of the semiconductor photodetector element 100 even more. This structure is preferred also because, when a proximity sensor and an illuminance sensor are formed on the same chip, stray light seeping from an LED for the proximity sensor can affect the illuminance sensor.

In the first embodiment, where the N-type semiconductor layer 14 constituting part of the third photodiode 40 is formed to have a depth equal to or greater than the depth of the N-type well layer 11, excess carriers generated by incident light that enters from the sides and back of the semiconductor photodetector element 100 are readily captured by the third photodiode 40, and a photoelectric current running deep in the semiconductor photodetector element 100 is removed as well. In this case, a depletion layer is preferred to be extended by applying as high a reverse bias voltage as possible to the third photodiode 40.

Figure 22:
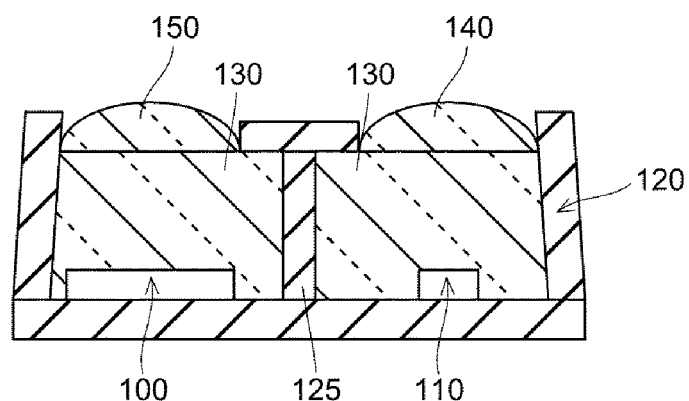
FIG. 22 is a sectional view illustrating a semiconductor device according to the first embodiment of the present invention.

FIG. 22 is a sectional view of a semiconductor device according to the first embodiment of the present invention. The semiconductor device according to the first embodiment of the present invention is described next with reference to FIG. 22.

The semiconductor device according to the first embodiment includes the semiconductor photodetector element 100 described above and an infrared light emitting diode element (hereinafter, referred to as LED) 110 for a proximity sensor which emits near-infrared light. The semiconductor photodetector element 100 and the LED 110 are housed in a housing 120, and the interior of the housing 120 is filled with a resin material 130, which has translucency. A light shielding wall 125 which does not transmit infrared light separates the semiconductor photodetector element 100 and the LED 110 from each other in order to prevent malfunction caused by a signal that travels back when reflected directly by the inner walls of the housing 120. The LED 110 is an example of a "light emitting element" of the present invention.

The semiconductor photodetector element 100 and the LED 110 are disposed at a given distance from each other. The LED 110 has a function of emitting near-infrared light whose light emission peak wavelength is 830 nm. A lens 140 is provided above the LED 110 to focus near-infrared light from the LED 110 on a target. A lens 150 is provided above the semiconductor photodetector element 100 to focus light on the semiconductor photodetector element 100. The lens 140 is an example of a "first lens" of the present invention, and the lens 150 is an example of a "second lens" of the present invention.

In the semiconductor device according to the first embodiment, the light shielding wall 125 is formed to separate the LED 110 and the semiconductor photodetector element 100 from each other as described above. The light shielding wall 125 is made from a material that does not transmit infrared light emitted by the LED 110 (for example, epoxy resin).

In the semiconductor device according to the first embodiment which includes the semiconductor photodetector element 100 and the LED 110 as described above, an illuminance sensor and a proximity sensor can be integrated into a single package. The semiconductor device is thus reduced in size.

In the first embodiment where the semiconductor photodetector element 100 described above is mounted, there is no need to use an expensive interference filter film and the manufacturing cost is accordingly reduced. In addition, the package (semiconductor device) is readily reduced in size because there is no need to secure a space for attaching an interference filter film.

Mounted with the semiconductor photodetector element 100 described above, the semiconductor device according to the first embodiment is high in precision. The semiconductor device structured as above is also capable of preventing malfunction and therefore has improved reliability.

In the first embodiment, where the lens 150 is provided above the semiconductor photodetector element 100 to focus light on the semiconductor photodetector element 100, the sensors can share a lens instead of using their respective lenses (lens for the illuminance sensor and a lens for the proximity sensor), which is another factor contributing to the reduction of the manufacturing cost.

Second Embodiment

Figure 23:
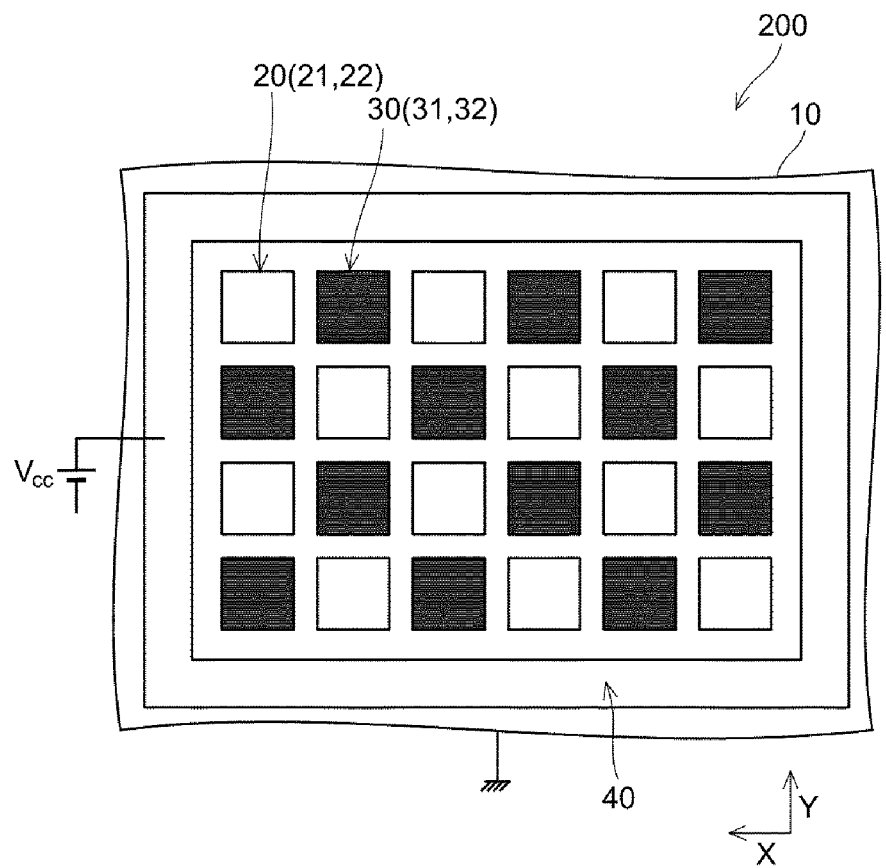
FIG. 23 is a plan view illustrating part of a semiconductor photodetector element according to a second embodiment of the present invention.
Figure 24:
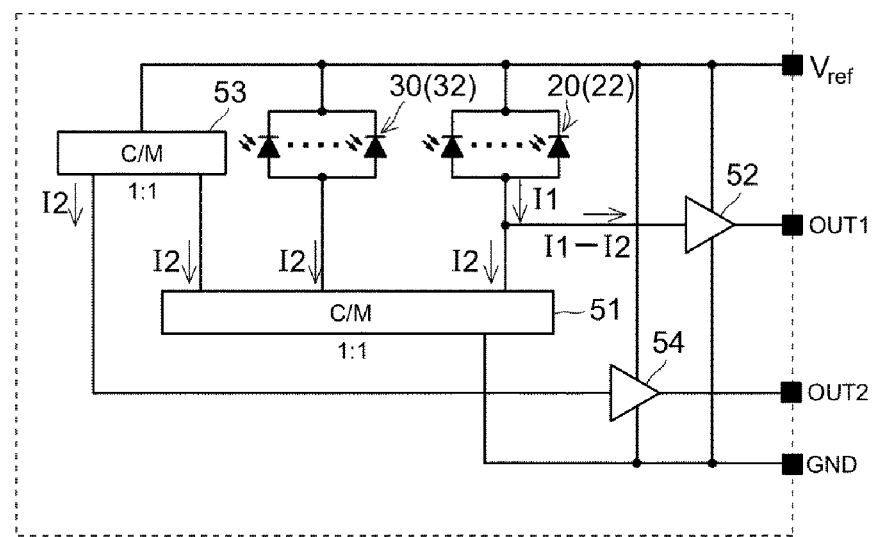
FIG. 24 is a circuit diagram illustrating a structure of an arithmetic circuit portion of the semiconductor photodetector element according to the second embodiment of the present invention.

FIG. 23 is a plan view illustrating part of a semiconductor photodetector element according to a second embodiment of the present invention. FIG. 24 is a circuit diagram illustrating a structure of an arithmetic circuit portion of the semiconductor photodetector element according to the second embodiment of the present invention. FIG. 23 shows a planar layout in which first photodiodes 20 (illuminance sensor portions 22) and second photodiodes 30 (proximity sensor portions 32) are arranged alternately with each other. A semiconductor photodetector element 200 according to the second embodiment of the present invention is described next with reference to FIGS. 23 and 24.

In the semiconductor photodetector element 200 according to the second embodiment, a plurality of first photodiodes 20 and as many second photodiodes 30 as the number of the first photodiodes 20 are formed in a P-type silicon substrate 10 as illustrated in FIG. 23. The first photodiodes 20 and the second photodiodes 30 are formed such that light receiving faces of the first photodiodes 20 and light receiving faces of the second photodiodes 30 have the same surface area.

As illustrated in FIG. 24, the plurality of first photodiodes 20 are connected in parallel to each other and the plurality of second photodiodes 30 are connected in parallel to each other. The first photodiodes 20 and the second photodiodes 30 are arranged alternately to form a grid pattern as illustrated in FIG. 23.

The first photodiodes 20 and the second photodiodes 30 may be arranged in other patterns than the grid pattern, for example, a staggered pattern. Further, the first photodiodes 20 and the second photodiodes 30 are preferred to be arranged such that the number of the first photodiodes 20 aligned in a direction X and the number of the second photodiodes 30 aligned in the direction X match each other. Similarly, it is preferred that if the number of the first photodiodes 20 aligned in a direction Y and the number of the second photodiodes 30 aligned in the direction Y match each other. This structure allows light seeping from, for example, the direction X to enter the first photodiodes 20 and the second photodiodes 30 in the same manner.

The alternating pattern of the first photodiodes 20 and the second photodiodes 30 does not need to be completely regular, and it is sufficient if the arrangement of the first photodiodes 20 and the second photodiodes 30 follows some rule in plan view and takes into account light that seeps from the back and periphery of the semiconductor photodetector element 200. The first photodiodes 20 and the second photodiodes 30 are preferred to be geometrically evenly arranged.

The rest of the structure of the semiconductor photodetector element 200 according to the second embodiment is the same as in the first embodiment.

In the second embodiment, as described above, a plurality of first photodiodes 20 and as many second photodiodes 30 as the number of the first photodiodes 20 are formed in the P-type silicon substrate 10, and the first photodiodes 20 and the second photodiodes 30 are arranged alternately. When the semiconductor photodetector element 200 is irradiated with light, it is therefore easy to make light entering the first photodiodes 20 (illuminance sensor portions 22) and light entering the second photodiodes 30 (proximity sensor portions 32) substantially equal to each other. Consequently, it is easy to ensure that ambient light or other light irradiating the semiconductor photodetector element 200 enters the first photodiodes 20 and the second photodiode 30 in the same manner. Then the influence of incident ambient light or the like is readily eliminated by subtracting a detection signal of the second photodiodes 30 from a detection signal of the first photodiodes 20. As a result, malfunction caused by ambient light or stray light from an LED for the proximity sensor, or by unequal incident light due to a difference in distance, is prevented easily, and hence the reliability is improved even more.

Other effects of the semiconductor photodetector element 200 according to the second embodiment are the same as those in the first embodiment.

A semiconductor device according to the second embodiment is a semiconductor device to which the semiconductor photodetector element 200 of the second embodiment described above is mounted.

In the semiconductor device according to the second embodiment which is structured as above, the influence of ambient light and light seeping from an LED is easily eliminated by computation. The semiconductor device is therefore easily reduced in package size while improved in precision and reliability.

Other effects of the semiconductor device according to the second embodiment are the same as those in the first embodiment.

Third Embodiment

Figure 25:
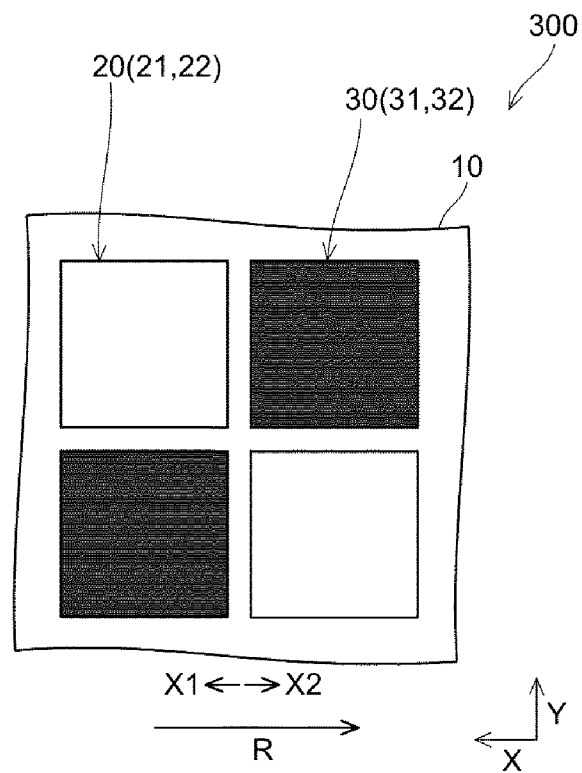
FIG. 25 is a plan view illustrating part of a semiconductor photodetector element according to a third embodiment of the present invention.
Figure 26:
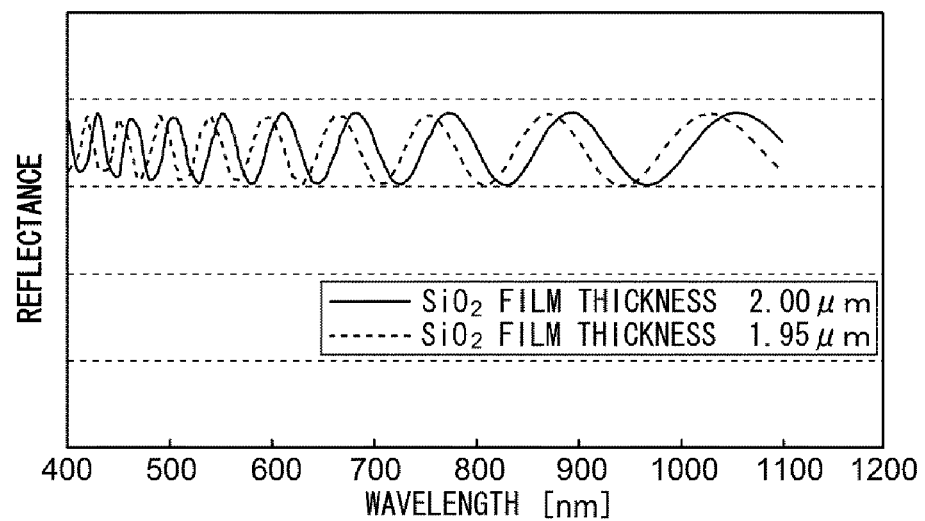
FIG. 26 is a graph showing results of a simulation of wavelength dependence in which thickness of a $SiO_2$ film formed above a light receiving element is varied.
Figure 27:
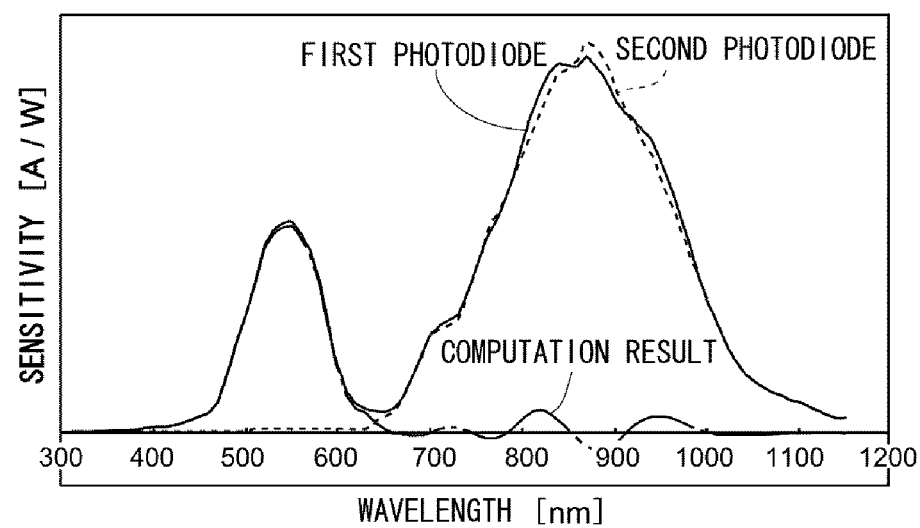
FIG. 27 is a graph showing a spectral sensitivity curve of a first photodiode, a spectral sensitivity curve of a second photodiode, and a spectral sensitivity curve obtained from a difference between these two curves which are simulated with the thickness of the $SiO_2$ film varied.
Figure 28:
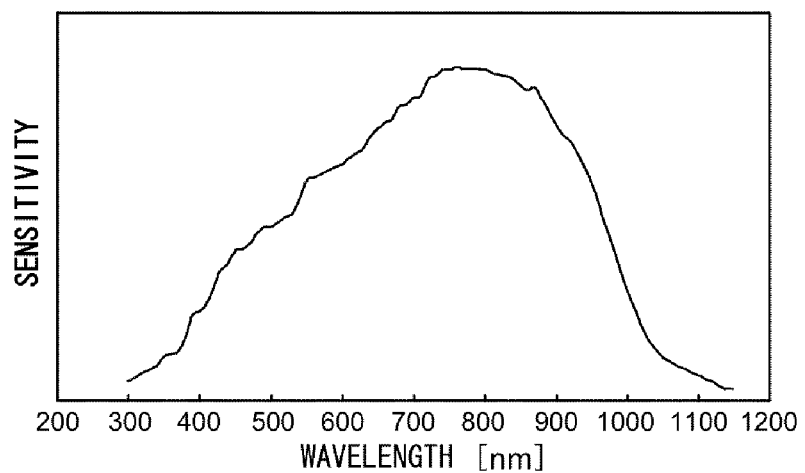
FIG. 28 is a graph showing a spectral sensitivity curve of a silicon photodiode.
Figure 29:
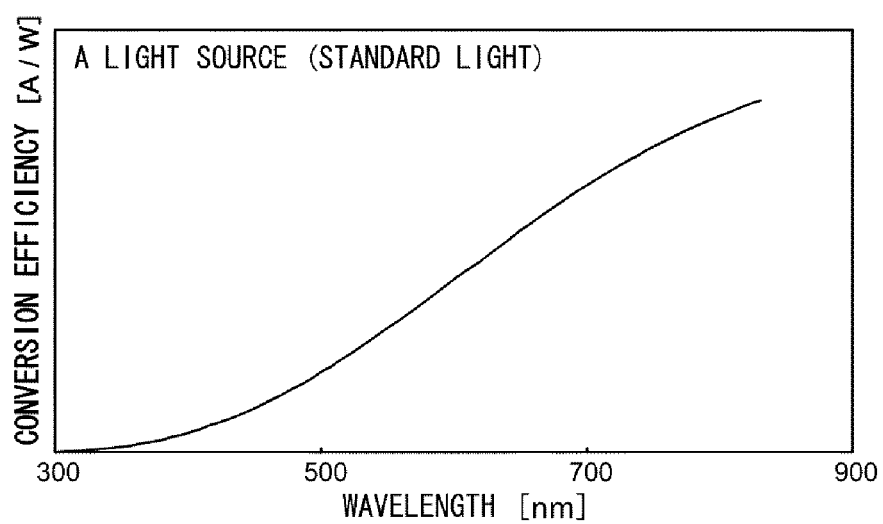
FIG. 29 is a graph showing a spectrum distribution of an A light source.

FIG. 25 is a plan view illustrating part of a semiconductor photodetector element according to a third embodiment of the present invention. FIG. 26 is a graph showing results of a simulation of wavelength dependence in which the thickness of an $SiO_2$ film formed above a light receiving element is varied. FIG. 27 is a graph showing a spectral sensitivity curve of a first photodiode, a spectral sensitivity curve of a second photodiode, and a spectral sensitivity curve obtained from a difference between those two curves which are simulated with the thickness of the $SiO_2$ film varied. FIG. 28 is a graph showing a spectral sensitivity curve of a silicon photodiode. FIG. 29 is a graph showing the spectrum distribution of an A light source.

FIG. 26 shows results of a simulation about the interference of light over light emitting elements (photodiodes) in relation to two $SiO_2$ films of different thicknesses (2.00 μm and 1.95 μm). FIG. 27 shows spectral sensitivity curves in which the light interference of FIG. 26 is taken into account. In the simulations of FIGS. 26 and 27, the calculation is made on the premise that a silicon substrate is used. A semiconductor photodetector element 300 according to the third embodiment of the present invention is described next with reference to FIG. 1 and FIGS. 25 to 29.

As illustrated in FIG. 1, an insulating film 61 is formed on the top face of a P-type silicon substrate 10 so as to cover a first photodiode 20 and a second photodiode 30. The insulating film 61 is made of, for example, $SiO_2$. A color filter layer 21 and a color filter layer 31 are formed on the top face of the insulating film 61. In this case, light enters the first photodiode 20 through the color filter layer 21, the insulating film 61, and other components. Further, light enters the second photodiode 30 through the color filter layer 31, the insulating film 61, and other components.

The insulating film 61 formed on the P-type silicon substrate 10 may have an uneven thickness due to factors related to its manufacture or other factors. Part of the insulating film 61 that is located above the first photodiode 20 and part of the insulating film 61 that is located above the second photodiode 30 therefore have different thicknesses in some cases.

The inventors of the present invention performed a simulation about the interference of light over a light receiving element using an $SiO_2$ film with a thickness of 2.00 μm and an $SiO_2$ film with a thickness of 1.95 μm. It was confirmed as a result that the difference in $SiO_2$ film thickness created a difference in phase as shown in FIG. 26. The light interference in the two $SiO_2$ films were overlaid with signals from light receiving elements covered with color filter layers. A result obtained through a subtraction is as shown in FIG. 27. It was found as a result that a difference between the first photodiode 20 and the second photodiode 30 in terms of the thickness of the overlying insulating film 61 caused a problem in that infrared light was not removed completely by the subtraction.

Accordingly, a thickness difference between part of the insulating film 61 above the first photodiode 20 and part of the insulating film 61 above the second photodiode 30 creates a difference in interference phase, despite the spectral sensitivities of the color filters matching completely, and the phase difference may cause signal fluctuations observed at a wavelength of 600 nm and above.

According to the simulation results, the signal fluctuates most around a wavelength of 800 nm to 900 nm, where the spectral sensitivity of silicon (silicon photodiode) of FIG. 28 is maximum. Infrared light is transmitted through the color filters (color filter layers 21 and 31) and, in order to make the sensitivity characteristics of the sensor equal to the visibility characteristics, infrared light is removed by subtraction. However, the signal fluctuates most around a wavelength of 800 nm to 900 nm when infrared light is removed by subtraction. In the case of the A light source of FIG. 29, in particular, where the spectrum of the light source has wavelength dependence, the signal fluctuations can cause a deviation from the actual visibility.

In order to remove infrared light completely by the calculation of a difference between the first photodiode 20 and the second photodiode 30, it is therefore preferred to ensure that part of the insulating film 61 that is located above the first photodiode 20 and part of the insulating film 61 that is located above the second photodiode 30 have exactly the same thickness.

However, forming the insulating film 61 to have an even thickness is not always easy due to factors related to its manufacture or other factors.

The semiconductor photodetector element 300 according to the third embodiment deals with this by reducing a signal difference (error) due to the uneven thickness of the insulating film 61. The reduction is accomplished by forming the same number of first photodiodes 20 and second photodiodes 30 as illustrated in FIG. 25 and arranging those first photodiodes 20 and second photodiodes 30 close to one another in a vertically and horizontally symmetrical pattern in plan view.

Specifically, in the third embodiment, a plurality of first photodiodes 20 and as many second photodiodes 30 as the number of the first photodiodes 20 are formed in the P-type silicon substrate 10. The first photodiodes 20 and the second photodiodes 30 are formed such that light receiving faces of the first photodiodes 20 and light receiving faces of the second photodiodes 30 have the same area. In the third embodiment, two first photodiodes 20 and two second photodiodes 30 are formed.

The plurality of (two) first photodiodes 20 are connected in parallel to each other and the plurality of (two) second photodiodes 30 are connected in parallel to each other. The first photodiodes 20 (color filter layers 21) and the second photodiodes 30 (color filter layers 31) are arranged closely to each other and alternately to form a grid pattern. In other words, the first photodiodes 20 (color filter layers 21) and the second photodiodes 30 (color filter layers 31) are arranged to form a geometrically symmetrical pattern.

It is preferred that the first photodiodes 20 and the second photodiodes 30 be placed as close (in proximity) to one another as permitted by a design rule or the like. The expressions "vertically and horizontally symmetrical" and "geometrically symmetrical" comprehend point symmetry (in particular, two-fold symmetry) and line symmetry (in particular, line symmetry in the positional relation between the first photodiodes 20 and the second photodiodes 30).

With this structure where the light receiving elements (photodiodes) are arranged alternately, when the insulating film 61 has an uneven thickness and, for example, becomes thicker toward a direction indicated by an arrow R of FIG. 25, the alternating arrangement makes the first photodiode 20 and the second photodiode 30 on the left hand side (X1 side) equal to each other in terms of the thickness of the insulating film 61, and also makes the first photodiode 20 and the second photodiode 30 on the right hand side (X2 side) equal to each other in terms of the thickness of the insulating film 61.

Therefore, the first photodiode 20 and the second photodiode 30 on the left hand side detect the same signal, and the first photodiode 20 and the second photodiode 30 on the right hand side detect the same signal. A signal obtained by combining (integrating) signals of the two first photodiodes 20 and a signal obtained by combining (integrating) signals of the two second photodiodes 30 consequently have the same magnitude. The detected signals are thus evened by being combined (integrated), despite the uneven thickness of the insulating film 61 which is due to factors related to its manufacture or other factors. As a result, the signal difference (error) caused by the difference in the thickness of the insulating film 61 between the first photodiode 20 and the second photodiode 30 is made very small.

The signal difference (error) can be made very small also when the insulating film 61 becomes thicker toward other directions than the direction indicated by the arrow R of FIG. 25, for example, toward a vertical direction or a diagonal direction (e.g., diagonally toward the upper right corner or the lower right corner).

In the third embodiment, as described above, the first photodiodes 20 and the second photodiodes 30 are arranged close to one another in a vertically and horizontally symmetrical (alternating) pattern. This makes a signal difference caused by the difference in the thickness of the insulating film 61 between the first and second photodiodes very small, and the precision of the semiconductor photodetector element is thus improved more.

The rest of the structure of the third embodiment and other effects of the third embodiment are the same as in the first and second embodiments.

In the third embodiment, there has been described an example in which two first photodiodes 20 and two second photodiodes 30 are formed and these four photodiodes are arranged in a geometrically symmetrical pattern. However, the number of the first photodiodes 20 and the number of the second photodiodes 30 may be larger than 2.

Figure 30:
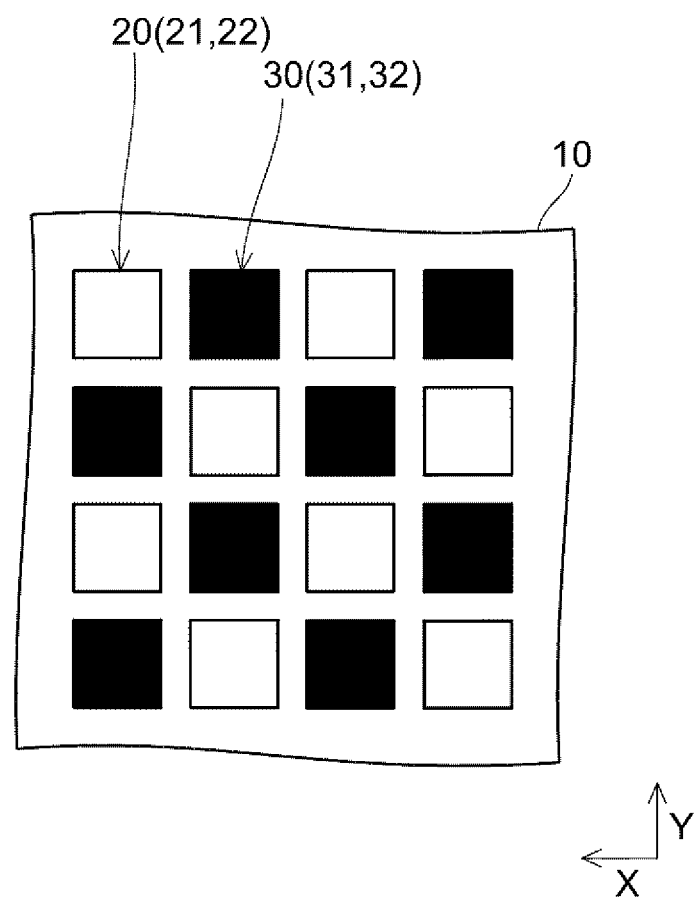
FIG. 30 is a plan view illustrating part of another example of the semiconductor photodetector element according to the third embodiment of the present invention.

For instance, four first photodiodes 20 and four second photodiodes 30 may be formed as illustrated in FIG. 30, where these eight photodiodes are arranged in a geometrically symmetrical pattern. Other number than 4 may be chosen as the number of the first photodiodes 20 and the number of the second photodiodes 30.

Increasing the first photodiodes 20 and the second photodiodes 30 in number further evens out the influence of the fluctuating thickness of the insulating film 61, and the signal difference caused by a difference in the thickness of the insulating film 61 between the photodiodes is made even smaller.

Increasing the first photodiodes 20 and the second photodiodes 30 in number improves the precision further but enlarges invalid regions (regions that do not detect light) between the first photodiodes 20 and the second photodiodes 30. Therefore, to secure the same light receiving area, a larger element size (chip size) is required.

In contrast, forming two first photodiodes 20 and two second photodiodes 30 as in the third embodiment is preferred because the signal difference due to a difference in the thickness of the insulating film 61 is made very small while the invalid regions are kept from expanding.

Modification Example of the Third Embodiment

Figure 31:
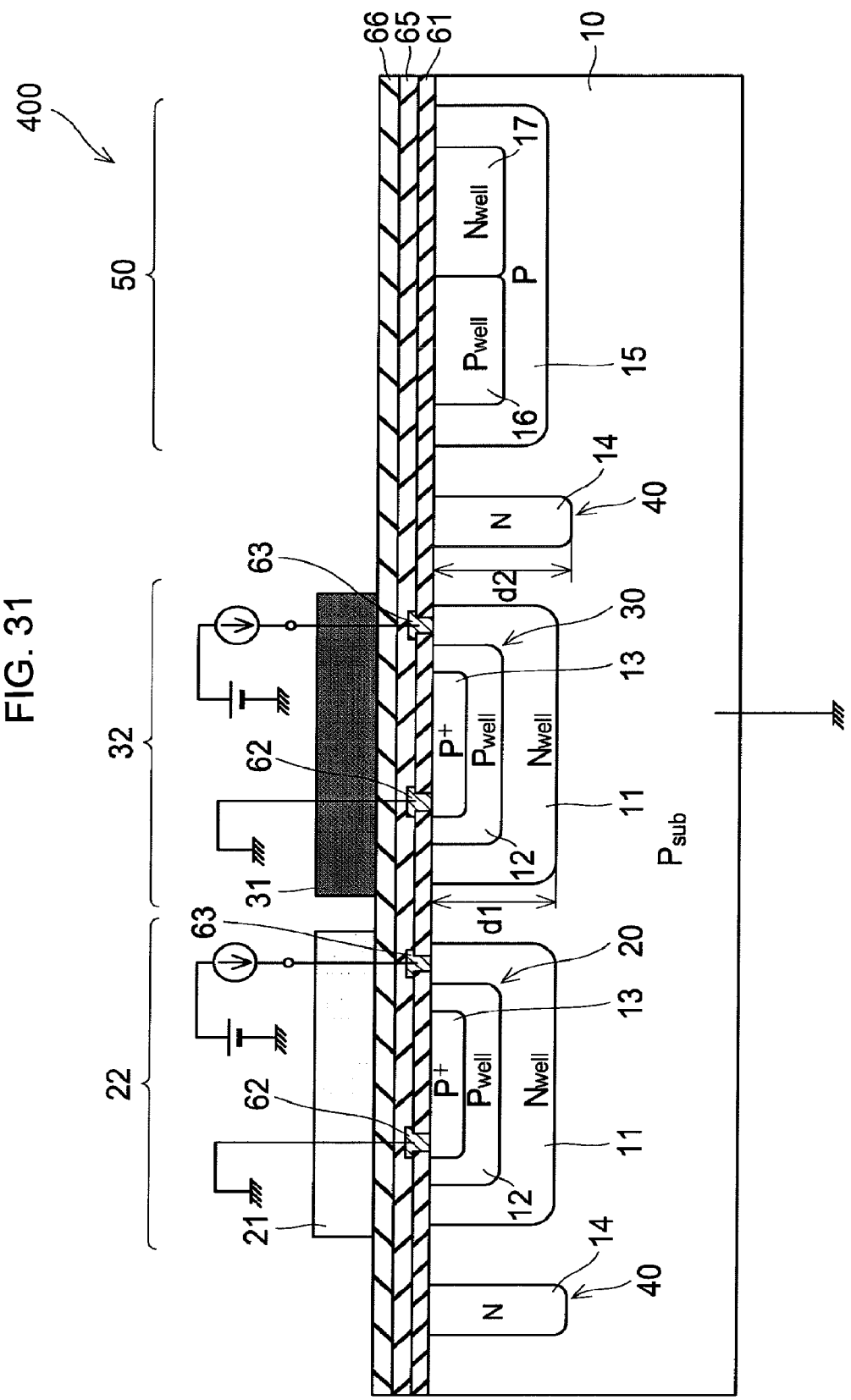
FIG. 31 is a sectional view illustrating a semiconductor photodetector element according to a modification example of the third embodiment.

FIG. 31 is a sectional view illustrating a semiconductor photodetector element according to a modification example of the third embodiment. FIGS. 32 to 35 are graphs showing the spectral sensitivity characteristics of photodiodes constituted of PN junctions between an N-type well layer and a P-type silicon substrate in the semiconductor photodetector element according to the modification example of the third embodiment. The semiconductor photodetector element according to the modification example of the third embodiment which is denoted by 400 is described next with reference to FIGS. 31 to 35.

In the semiconductor photodetector element 400 according to the modification example of the third embodiment, the first photodiode 20 and the second photodiode 30 both have a common anode unlike the photodiodes 20 and 30 of the third embodiment. Detection signals of the first photodiode 20 and the second photodiode 30 are taken out of the N-type well layer 11. The modification example of the third embodiment is therefore structured such that light can be detected also by photodiodes constituted of PN junctions between the N-type well layer 11 and the P-type silicon substrate 10.

Figure 32:
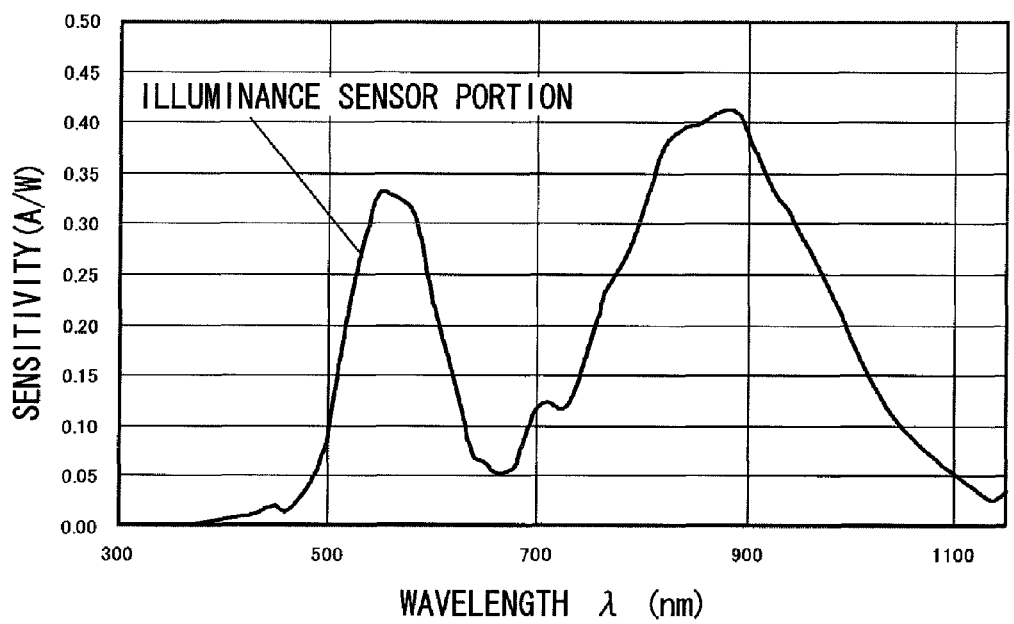
FIG. 32 is a graph showing spectral sensitivity characteristics of a photodiode which is constituted of a PN junction between an N-type well layer and a P-type silicon substrate in the semiconductor photodetector element according to the modification example of the third embodiment (graph showing a relation between the sensitivity and the light wavelength in an illuminance sensor portion)
Figure 33:
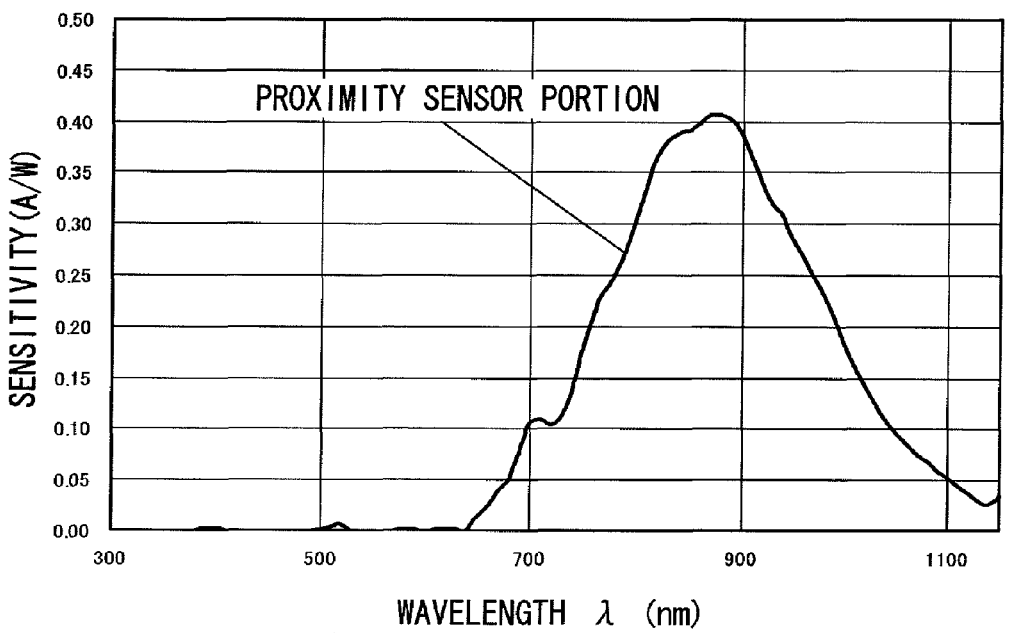
FIG. 33 is a graph showing an example of the spectral sensitivity characteristics of another photodiode constituted of the PN junction between the N-type well layer and the P-type silicon substrate in the semiconductor photodetector element according to the modification example of the third embodiment (graph showing a relation between the sensitivity and the light wavelength in a proximity sensor portion)

One of the photodiodes constituted of PN junctions between the N-type well layer 11 and the P-type silicon substrate 10 that is associated with the illuminance sensor portion 22 has spectral sensitivity characteristics shown in FIG. 32. The spectral sensitivity characteristics of FIG. 32 are similar to those of the first photodiode 20, and have the peak sensitivity in a wavelength range of 450 nm to 650 nm (visible light range, here, referred to as first wavelength range) and also have sensitivity in a wavelength range of 700 nm and above (near-infrared range, here, referred to as second wavelength range). The other of the photodiodes is related to the proximity sensor portion 32 and has spectral sensitivity characteristics shown in FIG. 33. The spectral sensitivity characteristics of FIG. 33 are similar to those of the second photodiode 30, and have sensitivity in a wavelength range of 700 nm and above (near-infrared range, here, referred to as third wavelength range). However, in the photodiodes that are constituted of PN junctions between the N-type well layer 11 and the P-type silicon substrate 10, the sensitivity in the near-infrared range is higher than the sensitivity in the visible light range. Therefore, when a sensor design puts importance to the sensitivity of a proximity sensor over the precision of an illuminance sensor, the sensitivity to infrared light is high in the proximity sensor and the modification example provides a proximity sensor that has a better S/N ratio than one accomplished by the method of the third embodiment.

Figure 34:
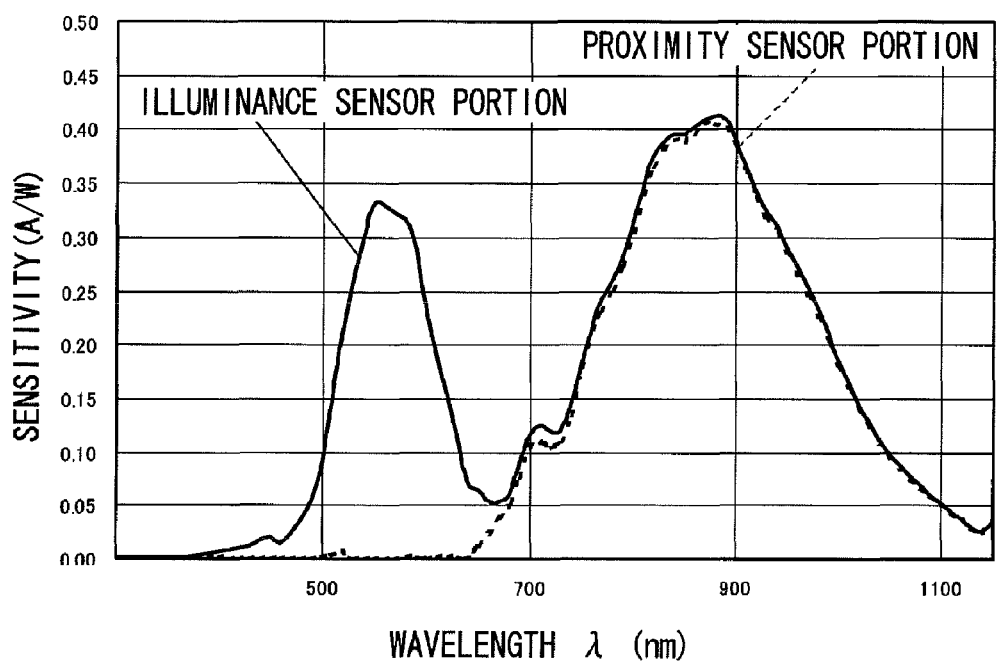
FIG. 34 is a graph showing an example of the spectral sensitivity characteristics of the photodiodes constituted of the PN junctions between the N-type well layer and the P-type silicon substrate in the semiconductor photodetector element according to the modification example of the third embodiment (graph showing a spectral sensitivity curve of the illuminance sensor portion and a spectral sensitivity curve of the proximity sensor portion which are overlaid with each other)
Figure 35:
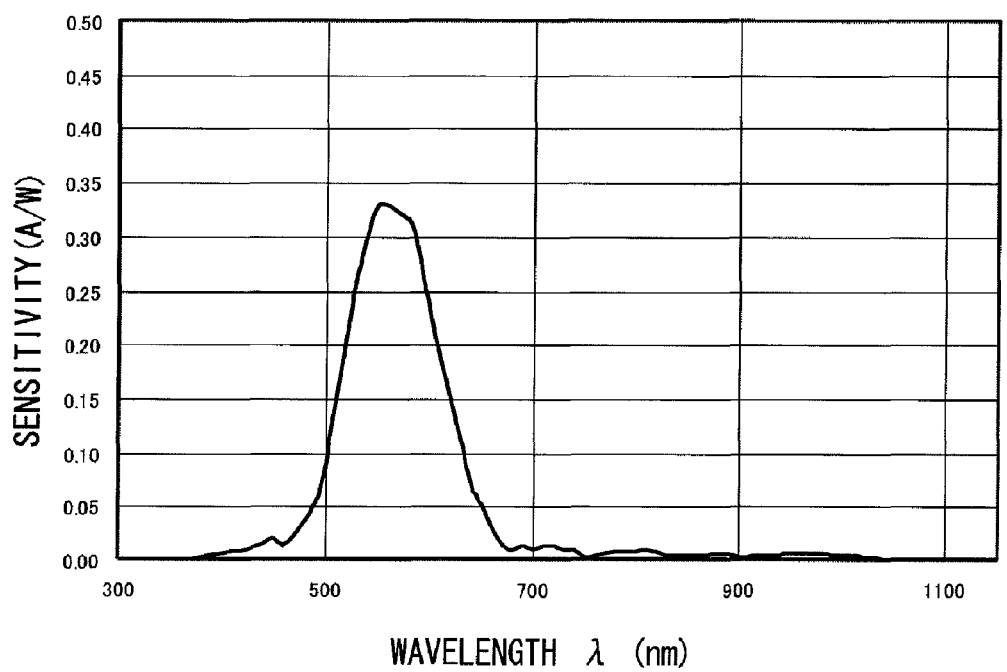
FIG. 35 is a graph showing an example of the spectral sensitivity characteristics of the photodiodes constituted of the PN junctions between the N-type well layer and the P-type silicon substrate in the semiconductor photodetector element according to the modification example of the third embodiment (graph showing a spectral sensitivity curve that is obtained by subtracting the spectral sensitivity curve (detection signal) of the proximity sensor portion from the spectral sensitivity curve (detection signal) of the illuminance sensor portion.

In the case of the photodiodes that are constituted of PN junctions between the N-type well layer 11 and the P-type silicon substrate 10, the spectral sensitivity of the illuminance sensor portion 22 on the long wavelength side (700 nm and above) and the spectral sensitivity of the proximity sensor portion 32 on the long wavelength side (700 nm and above) practically match as shown in FIG. 34. Therefore, when the arithmetic circuit portion 50 subtracts a detection signal detected by the proximity sensor portion 32 from a detection signal detected by the illuminance sensor portion 22, sensitivity characteristics shown in FIG. 35 are obtained which are sufficiently lowered in sensitivity to infrared light to be equivalent to the human visibility characteristics.

Setting the impurity concentration of the P-type silicon substrate 10 low expands a depletion layer which is formed of a PN junction and stretches toward the P-type silicon substrate 10. This increases the amount of holes generated in a photodiode per unit surface area, and also lowers the recombination center density of carriers in the P-type silicon substrate 10. As a result, a ratio at which carriers generated by light are lost is also reduced, and the sensitivity to long wavelength light (red light, in particular) which penetrates silicon deeper is improved.

In the case of silicon, however, light lower in energy than the band gap is hardly absorbed and only the sensitivity to light having a wavelength of 1.15 μm or less is improved. For example, light having a wavelength of 1.15 μm is absorbed by silicon at an absorption coefficient $\alpha(\lambda)$ of approximately $\frac{1}{10}^4$ $\mu m^{-1}$, and is mostly transmitted and not sensed in the case of a silicon substrate with a thickness of 1 mm or less which is normally used.

The rest of the structure of the semiconductor photodetector element 400 according to the modification example of the third embodiment is the same as in the third embodiment. Other effects of the semiconductor photodetector element 400 according to the modification example of the third embodiment are the same as in the third embodiment. Modification examples of the first and second embodiments are similar to this modification example of the third embodiment.

Embodiments disclosed herein are provided as examples and shall not be construed to limit the present invention in any way. The scope of the present invention is defined by the scope of patent claims, not by the description of the embodiments given above, and further encompasses an equivalent of the scope of patent claims and any modifications that can be made within the scope.

For instance, in the first to third embodiments (including the modification example), there has been described a case in which photodiodes are formed in a silicon substrate. The present invention, however, is not limited thereto, and photodiodes may be formed in an epitaxial layer formed on a silicon substrate.

Further, in the first to third embodiments (including the modification example), there has been described a case in which an N-type well layer is formed to a thickness (depth) of approximately 7 μm to 10 μm. The present invention, however, is not limited thereto, and the N-type well layer can have a thickness (depth) outside of this range.

Further, in the first to third embodiments (including the modification example, there has been described a case in which a first photodiode and a second photodiode are completely enclosed by a third photodiode. The present invention, however, is not limited thereto, and the first photodiode and the second photodiode may not be enclosed by the third photodiode completely. In other words, the third photodiode may be discontinuous in some places.

Further, in the first to third embodiments (including the modification example, there has been described a case in which an LED that has the light emission peak wavelength at 830 nm is used as an LED for a proximity sensor. The present invention, however, is not limited thereto, and an LED whose light emission peak wavelength is not 830 nm may be used as the LED for the proximity sensor. For example, the LED for the proximity sensor may be an LED that has the light emission peak wavelength at 940 nm. In this case, a semiconductor photodetector element is preferred to be structured to have spectral sensitivity characteristics that have the peak wavelength around 940 nm in a wavelength range of 700 nm and above (near-infrared range). The semiconductor photodetector element (400) of the modification example, which has high sensitivity to long wavelength light, is particularly effective when an LED that emits light having a wavelength of 940 nm is used for the proximity sensor.

Further, in the first to third embodiments (including the modification example), the conductivity types of the components of the semiconductor photodetector element may be reversed from those given in the embodiments.

Further, in the first to third embodiments, there has been described a case in which an insulating film on a P-type silicon substrate (the insulating film 61 covering the photodiodes) is made of SiO$_2$. The present invention, however, is not limited thereto, and the insulating film may be formed of other dielectric materials than SiO$_2$. For instance, the insulating film may be formed of a nitride film instead of an oxide film. The insulating film may also have, for example, a layered structure in which a plurality of dielectric films are layered. To give a specific example, the layered structure may contain an oxide film (film thickness: approximately 8 nm), a nitride film (film thickness: approximately 50 nm), and an oxide film (film thickness: approximately 2 μm) in this order from the substrate side. The oxide films may be formed of, for example, SiO$_2$. The nitride film may be formed of, for example, SiN. Other structures than that may also be employed.

Note that, in the third embodiment, there has been described a case in which first photodiodes and second photodiodes are arranged in a grid pattern. The present invention, however, is not limited thereto, and the first photodiodes and second photodiodes may be arranged in other patterns than the grid pattern. It is preferred that the first photodiodes and the second photodiodes be arranged in a pattern that reduces signal fluctuations caused by a difference in the thickness of the insulating film (for example, a geometrically symmetrical pattern).

What is claimed is:

1. A semiconductor photodetector element, comprising:
   a first light receiving element portion which is formed in a semiconductor layer of one conductivity type;
   a second light receiving element portion which is formed in the semiconductor layer and has the same structure as that of the first light receiving element portion;
   a multi-layer film which is formed on the semiconductor layer;
   a first filter which is formed above the first light receiving element portion across the multi-layer film and transmits light in a first wavelength range and light in a second wavelength range, which differs from the first wavelength range; and
   a second filter which is formed above the second light receiving element portion across the multi-layer film and transmits light in a third wavelength range, which is contained within the second wavelength range,
   wherein the multi-layer film is, in a part thereof above the first and second light receiving element portions, composed of an organic material film and an oxide film, and, in another part thereof, composed of the organic material film, a nitride film, and the oxide film, and
   the semiconductor photodetector element is structured to calculate a difference between a detection signal of the first light receiving element portion and a detection signal of the second light receiving element portion.

2. A semiconductor photodetector element according to claim 1,
   wherein a plurality of the first light receiving element portions are formed in the semiconductor layer to be connected in parallel to one another, and the same number of the second light receiving element portions as a number of the first light receiving element portions are formed in the semiconductor layer to be connected in parallel to one another, and
   wherein the first light receiving element portions and the second light receiving element portions are arranged alternately.

3. A semiconductor photodetector element according to claim 2, wherein the first light receiving element portions and the second light receiving element portions are arranged close to one another.

4. A semiconductor photodetector element according to claim 2, wherein the first light receiving element portions and the second light receiving element portions are arranged in a vertically and horizontally symmetrical pattern in plan view.

5. A semiconductor photodetector element according to claim 2,
   wherein two first light receiving element portions and two second light receiving element portions are formed in the semiconductor layer, and
   wherein the two first light receiving element portions and the two second light receiving element portions are arranged close to one another in a grid pattern.

6. A semiconductor photodetector element according to claim 1,
   wherein the first wavelength range is a visible light range of 450 nm to 650 nm, and
   wherein the second wavelength range and the third wavelength range are each a near-infrared range of 700 nm and above.

7. A semiconductor photodetector element according to claim 1, further comprising a first sensor portion for detecting a brightness of surroundings, which includes the first light receiving element portion and the first filter,
   wherein the first sensor portion has a peak sensitivity in a wavelength range of 450 nm to 650 nm and also has sensitivity in a wavelength range of 700 nm and above.

8. A semiconductor photodetector element according to claim 1, further comprising a second sensor portion for detecting a distance from a target, which includes the second light receiving element portion and the second filter,
   wherein the second sensor portion has sensitivity in a wavelength range of 700 nm and above in terms of spectral sensitivity.

9. A semiconductor photodetector element according to claim 1, wherein the first filter and the second filter make spectral sensitivity characteristics of the first light receiving element portion and spectral sensitivity characteristics of the second light receiving element portion practically equal to each other in a wavelength range of 700 nm and above.

10. A semiconductor photodetector element according to claim 1,
    wherein the first filter comprises a green filter, and
    wherein the second filter comprises a black filter.

11. A semiconductor photodetector element according to claim 1, wherein the semiconductor layer comprises an arithmetic circuit portion formed therein to calculate a difference between a detection signal of the first light receiving element portion and a detection signal of the second light receiving element portion.

12. A semiconductor photodetector element according to claim 1,
    wherein the semiconductor layer is a P-type semiconductor layer,
    wherein the first light receiving element portion and the second light receiving element portion each include an N-type well layer, which is formed by diffusion on a top side of the P-type semiconductor layer, and a P-type well layer, which is formed by diffusion on a top side of the N-type well layer, and
    wherein detection signals of the first light receiving element portion and the second light receiving element portion are taken out of the P-type well layer.

13. A semiconductor photodetector element according to claim 12, wherein the N-type well layer is formed to have a thickness of 7 μm or more and 10 μm or less.

14. A semiconductor photodetector element according to claim 1, wherein the second filter comprises a single film.

15. A semiconductor photodetector element according to claim 1, wherein the semiconductor layer further comprises a third light receiving element portion formed to frame the first light receiving element portion and the second light receiving element portion in plan view.

16. A semiconductor device, comprising:
   a light emitting element which emits light toward a target; and
   the semiconductor photodetector element according to claim 1 which receives light reflected from the target.

17. A semiconductor device according to claim 16, wherein the light emitting element comprises an infrared light emitting diode element which emits near-infrared light at a light emission wavelength of 700 nm or more and 1,150 nm or less.

18. A semiconductor device according to claim 16, further comprising a first lens, which is placed above the light emitting element to focus light from the light emitting element on the target.

19. A semiconductor device according to claim 16, further comprising one second lens, which is placed above the first light receiving element portion and the second light receiving element portion in the semiconductor photodetector element to focus light on the semiconductor photodetector element.

20. A semiconductor photodetector element, comprising:
   a first light receiving element portion which is formed in a semiconductor layer of one conductivity type;
   a second light receiving element portion which is formed in the semiconductor layer and has the same structure as that of the first light receiving element portion;
   a first filter which is formed above the first light receiving element portion and transmits light in a first wavelength range and light in a second wavelength range, which differs from the first wavelength range; and
   a second filter which is formed above the second light receiving element portion and transmits light in a third wavelength range, which is contained within the second wavelength range,
   wherein the semiconductor photodetector element is structured to calculate a difference between a detection signal of the first light receiving element portion and a detection signal of the second light receiving element portion,
   the semiconductor layer further comprising a third light receiving element portion formed to frame the first light receiving element portion and the second light receiving element portion in plan view,
   wherein the third light receiving element portion comprises a diffusion layer, which has a conductivity type reverse to that of the semiconductor layer, formed in a surface region of the semiconductor layer, and
   wherein the diffusion layer has a depth equal to or greater than a depth of the first light receiving element portion and the second light receiving element portion.

* * * * *